(12) United States Patent
Yamada et al.

(10) Patent No.: US 7,166,855 B2
(45) Date of Patent: Jan. 23, 2007

(54) SURFACE POSITION DETECTING SYSTEM AND METHOD

(75) Inventors: Yuichi Yamada, Tochigi-ken (JP); Shigeyuki Uzawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/341,384

(22) Filed: Jan. 14, 2003

(65) Prior Publication Data

US 2003/0132401 A1 Jul. 17, 2003

Related U.S. Application Data

(62) Division of application No. 09/793,078, filed on Feb. 27, 2001, now Pat. No. 6,534,777, which is a division of application No. 08/904,867, filed on Aug. 1, 1997, now Pat. No. 6,559,465.

(30) Foreign Application Priority Data

| Aug. 2, 1996 | (JP) | ................................... 8-219039 |
| Aug. 22, 1996 | (JP) | ................................... 8-238626 |
| Oct. 14, 1996 | (JP) | ................................... 8-270690 |

(51) Int. Cl.
*G01N 21/86* (2006.01)

(52) U.S. Cl. ............................. 250/559.29; 250/559.3

(58) Field of Classification Search .......... 250/559.29, 250/559.3, 559.4, 559.39, 559.2, 548; 356/399, 356/400, 401, 376, 325; 355/53, 54, 55
See application file for complete search history.

(56) References Cited

U.S. PATENT DOCUMENTS

| 4,563,094 A | 1/1986 | Yamada ...................... 356/401 |
| 4,599,000 A | 7/1986 | Yamada ...................... 356/401 |
| 4,655,599 A | 4/1987 | Ayata et al. ................ 356/401 |
| 4,794,648 A | 12/1988 | Ayata et al. .................... 382/8 |
| 4,933,715 A | 6/1990 | Yamada et al. ................ 355/53 |
| 4,962,423 A | 10/1990 | Yamada et al. ............. 358/101 |
| 5,008,703 A | 4/1991 | Kawakami et al. ........... 355/53 |
| 5,118,957 A | 6/1992 | Kawashima et al. ........ 250/561 |
| 5,142,156 A | 8/1992 | Ozawa et al. ............... 250/548 |
| 5,150,391 A | 9/1992 | Ebinuma et al. ............. 378/34 |
| 5,157,700 A | 10/1992 | Kurosawa et al. ............ 378/34 |
| 5,168,512 A | 12/1992 | Iwamoto et al. .............. 378/34 |
| 5,172,402 A | 12/1992 | Mizusawa et al. ............ 378/34 |
| 5,182,615 A | 1/1993 | Kurosawa et al. .......... 356/400 |
| 5,285,488 A | 2/1994 | Watanabe et al. ............. 378/34 |
| 5,323,016 A | 6/1994 | Yamada et al. ............. 250/561 |

(Continued)

FOREIGN PATENT DOCUMENTS

EP 0 762 215 A1 3/1997

*Primary Examiner*—Que T. Le
(74) *Attorney, Agent, or Firm*—Fitzpatrick, Cella, Harper & Scinto

(57) ABSTRACT

A surface position detecting system for detecting surface information related to a substrate. The system includes a single sensor for measuring surface positions at plural locations on the substrate, while relatively scanning the substrate, a discriminating device for discriminating, beforehand, effectiveness/ineffectiveness of the sensor during scanning measurement, on the basis of information related to substrate processing, and a calculating device for calculating, during scanning measurement, the surface information of the substrate on the basis of the surface positions measured by the sensor discriminated as being effective by the discriminating device.

10 Claims, 21 Drawing Sheets

U.S. PATENT DOCUMENTS

| | | | |
|---|---|---|---|
| 5,377,251 A | 12/1994 | Mizusawa et al. | 378/34 |
| 5,499,099 A | 3/1996 | Sato et al. | 356/400 |
| 5,543,921 A | 8/1996 | Uzawa et al. | 356/401 |
| 5,585,925 A | 12/1996 | Sato et al. | 356/401 |
| 5,695,897 A | 12/1997 | Mitome et al. | 430/22 |
| 5,729,337 A | 3/1998 | Tanaka | 356/139.1 |
| 5,751,404 A | 5/1998 | Murakami et al. | 355/53 |
| 5,751,428 A | 5/1998 | Kataoka et al. | 356/401 |
| 5,780,866 A * | 7/1998 | Yamamura et al. | 250/559.22 |
| 5,793,471 A | 8/1998 | Kanda et al. | 355/53 |
| 5,920,398 A | 7/1999 | Iwanaga et al. | 356/401 |
| 5,925,887 A | 7/1999 | Sakai et al. | 250/548 |
| 5,986,766 A | 11/1999 | Koga et al. | 356/401 |
| 6,081,614 A | 6/2000 | Yamada et al. | 382/151 |
| 6,608,681 B2 * | 8/2003 | Tanaka et al. | 356/400 |

* cited by examiner

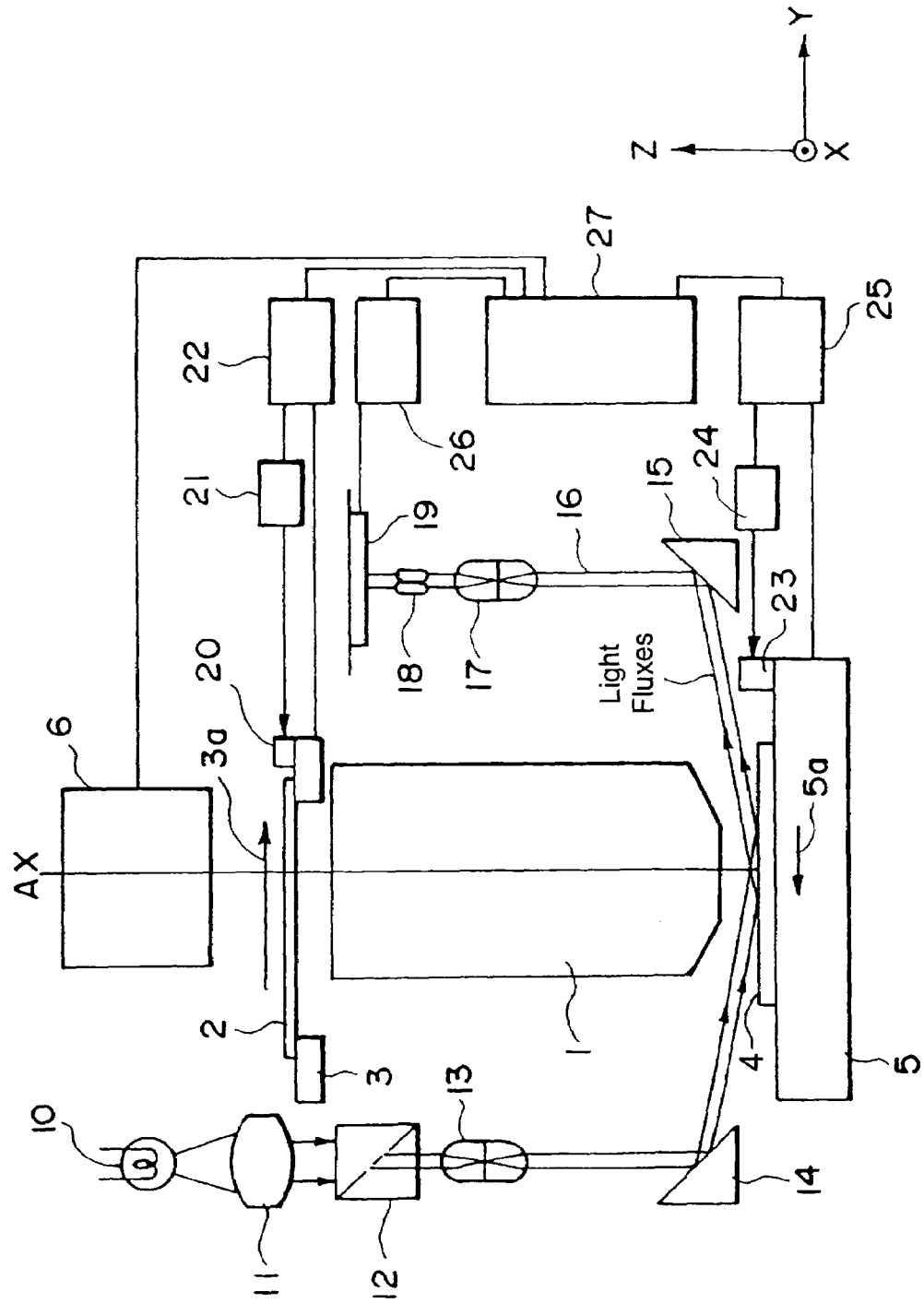
F I G. 4

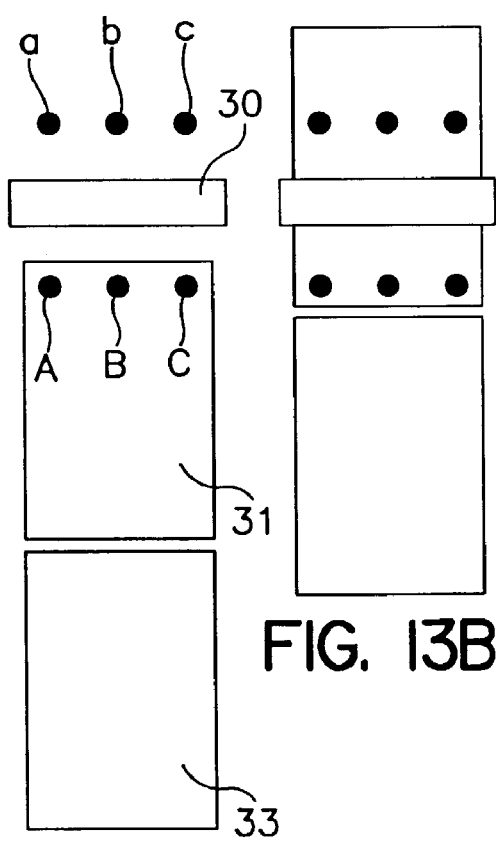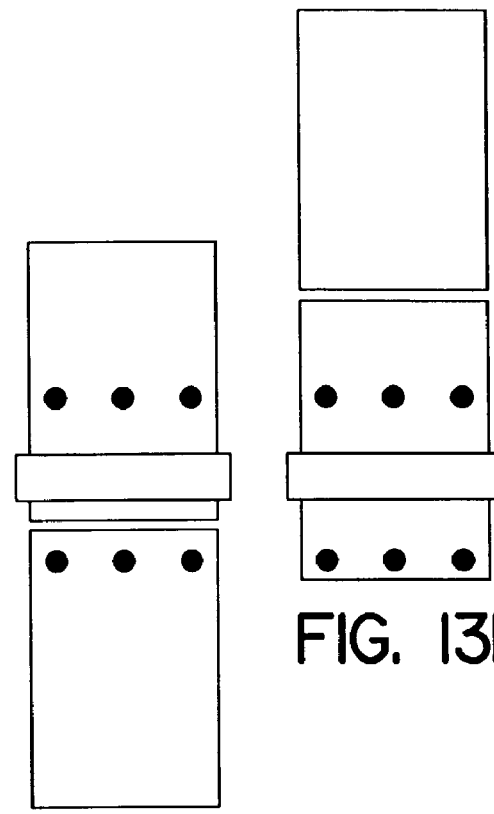
FIG. 13A
FIG. 13B
FIG. 13C
FIG. 13D

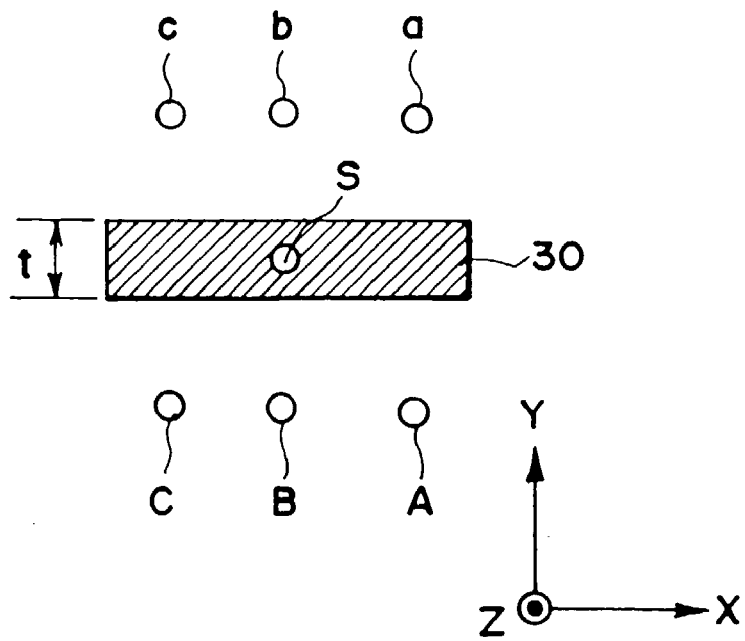
F I G. 17
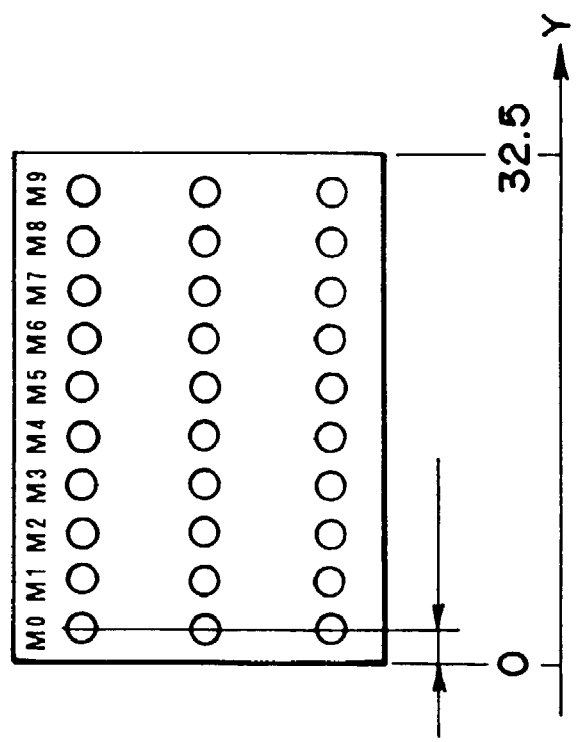
F I G. 18

SURFACE POSITION DETECTING SYSTEM AND METHOD

This application is a divisional of application Ser. No. 09/793,078, filed Feb. 27, 2001 now U.S. Pat. No. 6,534,777, which is a divisional of application Ser. No. 08/904,867, filed Aug. 1, 1997 now U.S. Pat. No. 6,559,465.

FIELD OF THE INVENTION AND RELATED ART

This invention relates to a surface position detecting method for detecting the level (height) or tilt of a surface of an object such as a wafer, for example, having a region with a pattern structure. More particularly, the invention is concerned with a surface position detecting method usable in a slit scan type exposure apparatus, for example, for continuously detecting position or tilt of a surface of a wafer, for example, with respect to an optical axis direction of a projection optical system of the exposure apparatus.

The size of recent memory chips is increasing because of a difference between the trend of cell size or resolvable line width of an exposure apparatus and the enlargement trend of memory capacity. For a first generation of 256 M, for example, it is reported that the size is about 14×25 mm.

For this chip size and with an exposure region having a diameter of 31 mm of a reduction projection exposure apparatus (stepper), which is currently used as an exposure apparatus for a critical layer, only one chip can be exposed per one exposure operation and the throughput is low. Thus, an exposure apparatus which enables a larger exposure area is required. For such a large field size exposure apparatus, there may be a semiconductor device exposure apparatus for a rough layer for which a high throughput is required or a reflection projection type exposure apparatus which is an exposure apparatus for a large picture field size liquid crystal display device such as a monitor. Such an apparatus is a slit scan exposure apparatus of a mask-to-wafer relative scan type wherein a mask is rectilinearly scanned with an arcuate slit-like illumination light and, by use of a concentric reflection mirror optical system, a wafer is exposed as a whole.

For focus adjustment of a mask image in such an apparatus, level measurement and corrective drive for autofocusing or auto-leveling are performed continuously during the scan exposure operation so that the surface, to be exposed, of a photosensitive substrate (wafer or glass plate which is coated with a photoresist, for example) is brought into registration with a best imaging plane of a projection optical system.

A height and surface position detecting mechanism in such an apparatus may use a method in which an oblique projection optical system for projecting light onto the surface of a wafer obliquely from above and reflection light from the photosensitive substrate is detected as a positional deviation upon a sensor, or a method in which a gap sensor such as an air microsensor or an electrostatic capacity sensor is used. From plural measured values during the scan, the amount of corrective drive for height and tilt as the measurement position passes the exposure slit region is calculated.

If only a projection system of a slit scan type exposure apparatus currently used is modified to provide a resolving power that meets 256 M or larger, the following problems arise.

As the numerical aperture (N.A.) of the reduction optical system is enlarged to meet miniaturization of a circuit pattern, the tolerable depth of focus during a circuit pattern transfer process is narrowed. Exposure apparatuses currently used for a rough layer process have a tolerable depth not less than 5 microns. Therefore, a measurement error included in measured values in continuous measurement during the scan exposure process or the effect of a surface step within a chip can be disregarded. However, for 245 M, the tolerable depth will be not greater than 1 micron. Thus, such a measurement error or the effect of a surface step could not be disregarded. More specifically, when the focus (height and tilt) of a wafer surface is measured and focus correction is performed to keep the wafer surface within the tolerable depth, since the wafer surface contains surface irregularities, offset correction is necessary to bring the chip or shot as a whole in registration with the image plane. In such a case, unless the focus measurement point at each shot is the same as those during the offset measurement, accurate offset correction is not assured. It may be assured in a stepper in which measurement is performed as the wafer is stopped at each shot. However, in a scan system, it is not assured. When an accumulation type sensor is used and if the cycle of accumulation start is a free running type, there is an inaccuracy in position corresponding to the accumulation time, that is, a deviation between a focus measurement point and an offset measurement point. Thus, offset correction is inaccurate.

In a surface position detecting mechanism which uses an oblique light projection optical system, the reflectivity of a surface to be detected may change. A received light signal may be too strong and a light receiving system may be saturated. Alternatively, it may be too small and the signal-to-noise ratio (S/N ratio) may be degraded. It causes low surface position detecting precision. Thus, during a scan exposure operation, it is necessary to adjust the gain (or light) of light receiving means or an emitted light quantity from light projecting means, in accordance with the reflectivity of the surface to be detected.

During continuous surface position measurement to a surface with different reflectivities during the scan, if the reflectivity of the surface is measured and the light is adjusted, the measurement time per one measurement operation may change and synchronism with respect to the stage position is broken. Thus, accurate offset correction is not attainable. Particularly, for an electric charge accumulation type sensor, an idle reading operation due to the light adjustment operation leads to a bottle neck of a response speed during the scan operation, and the throughput is lowered or there arise insufficiency of correction points. Thus, the surface position detection precision is degraded.

If a rectangular exposure area is sequentially transferred onto a wafer of a circular shape, as shown in FIGS. 1–3, at a peripheral portion of the wafer, a portion of the exposure area is out of the wafer region. In a wafer peripheral region, a multi-chip structure is adopted in which there are plural chips within the exposure area, this being to enable chip production even if a portion of the exposure area is missed (see FIG. 2). Thus, for such an exposure area in which a portion thereof is missing (non-rectangular portion), an ordinary exposure procedure has to be performed. In a structure in which one chip is present in an exposure region, such as in a case of a CPU, in the process of wafer surface clamping such as in an ion injection step or an RIE step, a photoresist remaining in a peripheral portion of the wafer may be separated and it may move to the pattern portion of the chip region, causing a pattern defect or dimension defect. It leads to degradation of the chip yield. It is, therefore, necessary to perform exposure to a non-rectangular portion to thereby remove any excessive resist thereon. Conventionally, during wafer exposure, the same exposure procedure is made to a non-rectangular portion at the peripheral portion of the wafer, as done to the rectangular portions inside the wafer.

In a slit scan type exposure apparatus, for exposure of a peripheral portion, focus is measured in real time and the wafer surface is corrected toward the lens image plane. Since, however, the exposure region (shot) is not rectangular as the wafer central portion, the focus measurement may end in failure and the exposure operation may be interrupted. Even if the error is detected and processed by use of software and the exposure process is continued, there remain an increase of processing time and synchronism delay with respect to a correction system. Thus, correction precision is not good.

SUMMARY OF THE INVENTION

It is an object of the present invention to provide a surface position detecting method by which the position of a surface to be detected can be detected precisely without being affected by a surface irregularity of the surface to be detected. Particularly, it may be applied to a slit scan exposure apparatus to ensure the synchronism with respect to position, in offset control for a focus measured value, and to assure high precision offset correction for a focus measured value and a high resolution pattern transfer operation.

It is another object of the present invention to assure improvement of surface position detection precision, by reducing or making constant the time for light adjustment during the scan measurement to thereby make constant the surface position measurement time during the scan. This enables the surface position detection in synchronism with the scan and accurate offset correction. Particularly, when it is applied to a slit scan exposure apparatus, the reflectivity of the region to be scan measured may be measured beforehand and the measurement cycle may be controlled to be constant, such that response delay with respect to synchronism with a servo system may be prevented.

It is a further object of the present invention to provide a surface position detecting system and method by which the point of surface position detection may be determined beforehand from the shape of the region to be processed, such that the position of that surface can be detected precisely without being affected by the shape of the region of the object to be detected. Particularly, it may be applied to high precision detection of focus, that is, the wafer surface position, in a slit scan type exposure system.

In accordance with an aspect of the present invention, there is provided a surface position detecting method wherein an object having a region with a pattern structure is relatively scanned relative to surface position detecting means and wherein surface position at plural detection points in the region is detected by use of the surface position detecting means, said method comprising the steps of: detecting an error in the detection by the surface position detecting means, with respect to each of the detection points, which error may result from a difference in pattern structure among the detection points; detecting, in synchronism with relative position of the object and the surface position detecting means, the surface position at each of the detection points by use of the surface position detecting means; and correcting the detected surface position on the basis of the error.

Said surface position detecting means may include light projecting means for projecting light obliquely onto the object and an accumulation type sensor for receiving reflection light from the object, and wherein said surface position detecting step includes detecting the surface position on the basis of the state of the reflection light.

Said surface position detecting step may include resetting the accumulation start timing of the sensor when the object and the surface position detecting means are placed in a predetermined relative position.

Said surface position detecting step may include driving the sensor and a scan control system for relatively scanning the object and the surface position detecting system, at the same clock timing.

When the surface position detection is to be done to plural objects having the same pattern structure, the error detection may be made with respect to a first one or ones of the object.

In accordance with another aspect of the present invention, there is provided a surface position detecting system having surface position detecting means including light projecting means for projecting light obliquely onto a detection point and light receiving means for receiving reflection light from the detection point, wherein, while an object having a region with a pattern structure is relatively scanned relative to said surface position detecting means, a surface position at plural points within the region is detected, said surface position detecting system comprising: optimum value detecting means for projecting, before the surface position detection, light from said light projecting means to each of the plural detection points and for receiving, with said light receiving means, reflection light from the point, said optimum value detecting means detecting and memorizing an optimum value of a gain of said light receiving means or a drive current for said light projecting means with respect to each detection point, on the basis of a light reception signal of said light receiving means; and setting means for setting an optimum value for a drive current for said light projecting means or a gain of said light receiving means with respect to each of the detection points, for the surface position detection.

Said optimum value detecting means may include calculating means for receiving reflection light from each detecting point while holding the drive current for the light projecting means and the gain of said light receiving means fixed in the state having been set before a start of the detection, and for calculating an optimum value on the basis of the drive current, the gain and a light reception signal.

Said optimum value detecting means may detect an optimum value while scanning the drive current for the light projecting means and the gain of the light receiving means with respect to each of the detection points.

The object may have plural regions with the same pattern structure and wherein said optimum value detecting means may detect an optimum value on the basis of one or some of the plural regions.

Said optimum value detecting means may detect an optimum value while relatively scanning the object and said surface position detecting means relative to each other.

Said system may further comprise discriminating means for discriminating whether a detected optimum value is within a tolerable range, wherein the optimum value detection may be repeated when the result of the discrimination is negative.

Said light receiving means may include a one-dimensional CCD sensor and wherein said setting means may set an optimum value for each detection point and then reset the CCD sensor and start the surface position detection at that detection point.

In accordance with a further aspect of the present invention, there is provided a surface position detecting method wherein surface position detecting means having a light projecting means for projecting light obliquely onto a detection point on light receiving means for receiving reflection light from the detection point is used and wherein, while relatively scanning an object having a region with a pattern structure relative to the surface position detecting means, a surface position with respect to plural detection points within the region is detected, said method comprising the steps of: projecting, before the surface position detection, light to each of the plural detection points and receiving, with the light receiving means, reflection light therefrom, and detecting and memorizing an optimum value of a drive current for the light projecting means or a gain of the light receiving means with respect to each detection point, on the basis of a light reception signal of the light receiving means; and performing the surface position detection while setting the drive current for the light projecting means or the gain of the light receiving means at the memorized optimum value, with respect to each of the detection points.

In accordance with a yet further aspect of the present invention, there is provided a surface position detecting system for detecting a surface position of a substrate, said system comprising: a plurality of sensors for measuring surface position at plural locations on the substrate, while relatively scanning the substrate; discriminating means for discriminating and memorizing, beforehand, effectiveness/ineffectiveness of each sensor at each measurement point during scanning measurement, on the basis of information related to the substrate processing; and calculating means for selecting, during scan measurement, one or those of the sensors of effective measured value on the basis of the discrimination information and for calculating the surface information of the substrate on the basis of a measurement output of the one or those sensors.

In accordance with a still further aspect of the present invention, there is provided a surface position detecting method wherein a plurality of sensors for measuring surface position of a substrate at plural locations while relatively scanning the substrate are used to detect a surface position corresponding to the measurement locations on the substrate, said method comprising the steps of: discriminating, beforehand, effectiveness/ineffectiveness of a measured value at each measurement location by a corresponding sensor during the scan measurement, on the basis of information related to the substrate processing; switching, during the scan measurement, sensors to be used for the measurement, dynamically, on the basis of the information of discrimination; and calculating the surface information of the substrate on the basis of a measurement output of the switched sensor or sensors.

In accordance with a yet further aspect of the present invention, there is provided an exposure method wherein a pattern of an original and a slit are projected onto a substrate through a projection optical system, wherein the original and the substrate are relatively scanned relative to the projection optical system in a direction perpendicular to a lengthwise direction of the slit whereby the pattern of the original is transferred onto the substrate, and wherein a plurality of sensors for measuring surface position of the substrate at plural locations are used to detect surface position corresponding to the measurement locations on the substrate, said method comprising the steps of: discriminating, beforehand, effectiveness/ineffectiveness of a measured value of each of the measurement points of the sensors during the scan measurement, on the basis of information related to the substrate processing; switching, during the scan measurement, sensors to be used for the measurement, on the basis of the information discrimination; calculating the surface information of the substrate on the basis of a measured output of the switched sensor or sensors; and determining, on the basis of the information of the discrimination, the order of shot processing so that, with regard to a shot with respect to which the number of effective sensors changes along the scan direction within that shot, the scan is done in a direction from a larger effective sensor number side to a smaller effective sensor number side.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a schematic view of a main portion of a slit scan type projection exposure apparatus in which a surface position detecting method according to a first embodiment of the present invention is used.

FIGS. 13A–13D are schematic views for explaining another example of measurement data check processing, in the light adjustment sequence of FIG. 10.

FIG. 17 is a schematic view for explaining disposition of sensors, in the apparatus of FIG. 15.

FIG. 18 is a schematic view for explaining focus measurement points in a shot, in the apparatus of FIG. 15.

DESCRIPTION OF THE PREFERRED EMBODIMENTS

Figure 1:
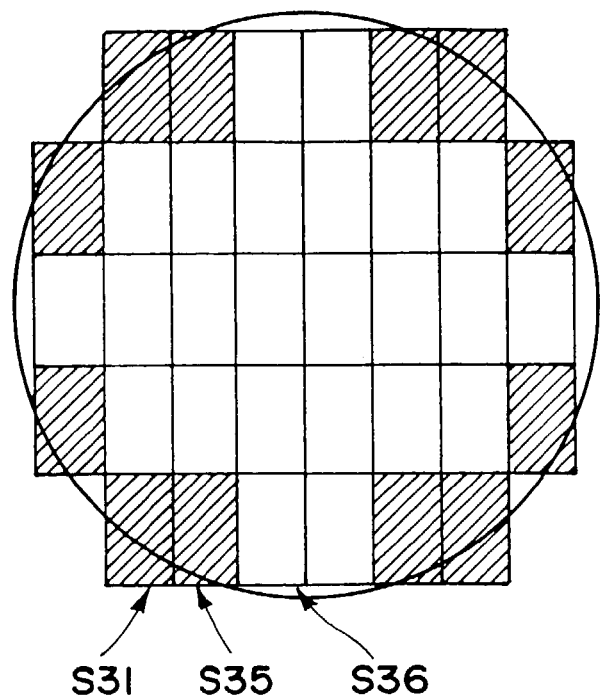
FIG. 1 is a schematic view for explaining an example of a shot layout on a wafer.

FIG. 4 is a schematic view of a main portion of a slit scan type projection exposure apparatus which uses a surface position detecting method according to a first embodiment of the present invention.

In FIG. 4, denoted at 1 is a reduction projection lens having an optical axis denoted at AX in the drawing. The image plane of it is perpendicular to the Z direction as illustrated. Reticle 2 is held by a reticle stage 3, and a pattern of the reticle 2 is projected in a reduced scale of 1:4 or 1:2 in accordance with the magnification of the reduction projection lens, whereby an image is formed on the image plane of the projection lens. Denoted at 4 is a wafer having a resist applied to its surface. There are a number of exposure regions (shots) on the wafer which are defined through a preceding exposure process or processes. Denoted at 5 is a stage on which the wafer is placed. It comprises a chuck for attracting and holding the wafer 4, an X-Y stage being movable horizontally in the X-axis direction and Y-axis direction, a leveling stage being movable in the Z-axis direction (optical axis direction of the projection lens 1) and being rotationally movable about axes parallel to the X and Y axes, and a rotatable stage being rotatable about an axis parallel to the Z axis. Thus, the stage 5 provides a six-axis correction system for bringing the reticle pattern image in registration with each exposure region on the wafer.

The elements denoted at 10–19 of FIG. 4 are components of a detection optical system for detecting the surface position and tilt of the wafer 4. Of these elements, denoted at 10 is a light source which comprises a white lamp or an illumination unit for providing light of a high-luminance light emitting diode having different peak wavelengths. Denoted at 11 is a collimator lens for receiving light from the light source 10 and providing parallel light of a substantially uniform sectional intensity distribution. Denoted at 12 is a prism-like slit member having a pair of prisms cemented with each other at opposes slant surfaces thereof. A plurality of windows (for example, seven pinholes) are defined at the cemented surface, by use of a light blocking film of chromium, for example. Denoted at 13 is a lens system which comprises a telecentric system. It serves to direct seven separate light fluxes, passing the pinholes of the slit member 12, respectively, to seven measurement points on the wafer 4 surface, via a mirror 14. While only two light fluxes are illustrated in FIG. 4, each beam represents three light fluxes juxtaposed in a direction perpendicular to the sheet of the drawing. Also, another light flux (not shown) is present between the two beams illustrated. Here, with respect to the lens system 13, the plane in which the pinholes are formed and the plane containing the wafer 4 surface are placed to satisfy the Scheinmpflug's condition.

Figure 5:
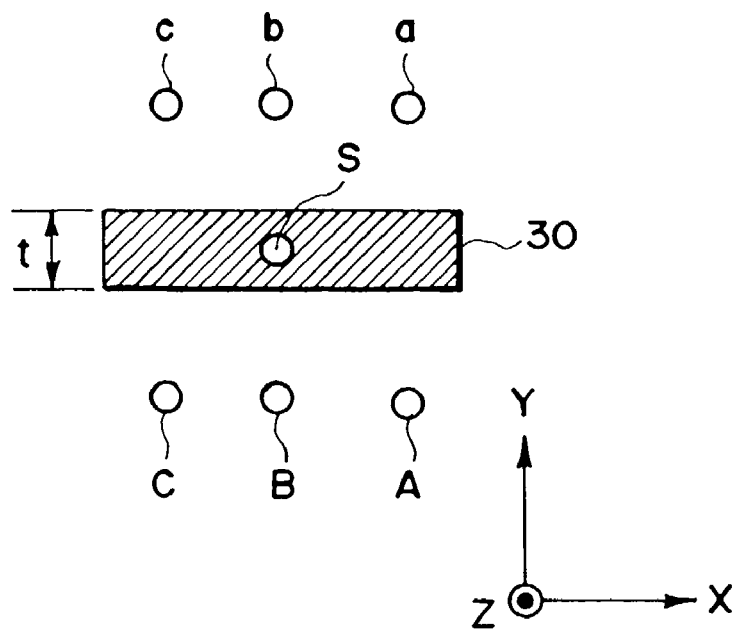
FIG. 5 is a schematic view for explaining a positional relation between an exposure slit and spots, in the apparatus of FIG. 4.
Figure 6:
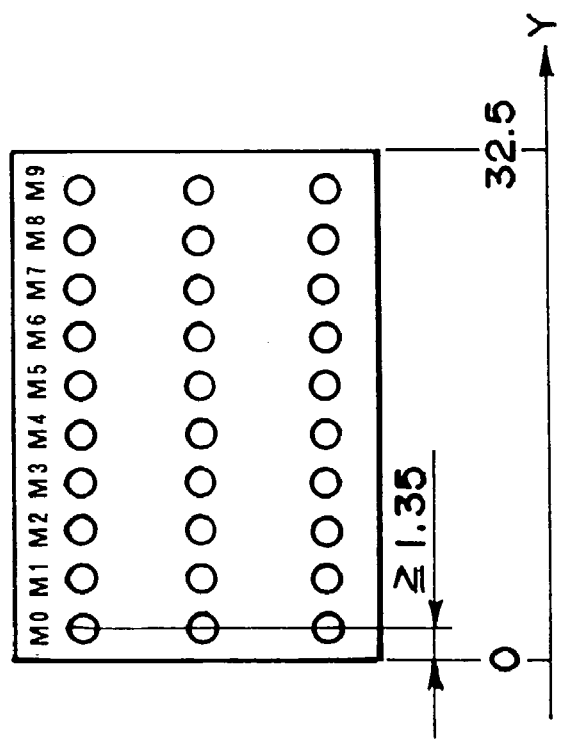
FIG. 6 is a schematic view for explaining measurement points of a chip on a wafer, in the example of FIG. 4.

FIG. 5 illustrates the positional relation between the slit (exposure slit) as projected on the wafer 4 by the projection optical system 1 and the seven measurement points (spots) defined on the wafer 4 surface. Also, FIG. 6 shows focus measurement points (detection points) on the wafer. In the apparatus of FIG. 4, the exposure slit has a size of 7×25 mm, and the exposure region (maximum shot size) has a size of 25×32.5 mm. As regards the spots, there are one spot at the center of the exposure slit 30, and a set of three spots at a distance 12 mm deviated in the scan direction from the center of the exposure slit 30; thus, a total of seven spots are there. When the wafer is to be scanned from below to above in FIG. 2 (upward scan), three channels of spots A, B, and C are used and, when the wafer is to be scanned from above to below in FIG. 3 (downward scan), three channels of spots a, b, and c are used, both for measuring the wafer level (position with respect to the Z direction). Thus, with respect to each spot, measurement is made at ten points (M0–M9) in the wafer measurement direction. The thus obtained measurement data is used thereafter as data for focus correction when each measurement point comes to the center of the exposure slit 30 as the wafer is scanned further. In other words, the focus correction is made on the basis of an antecedent focus reading at each measurement point (antecedent measurement). Spot S is a spot for an acquisition measurement spot on the slit.

Figure 7:
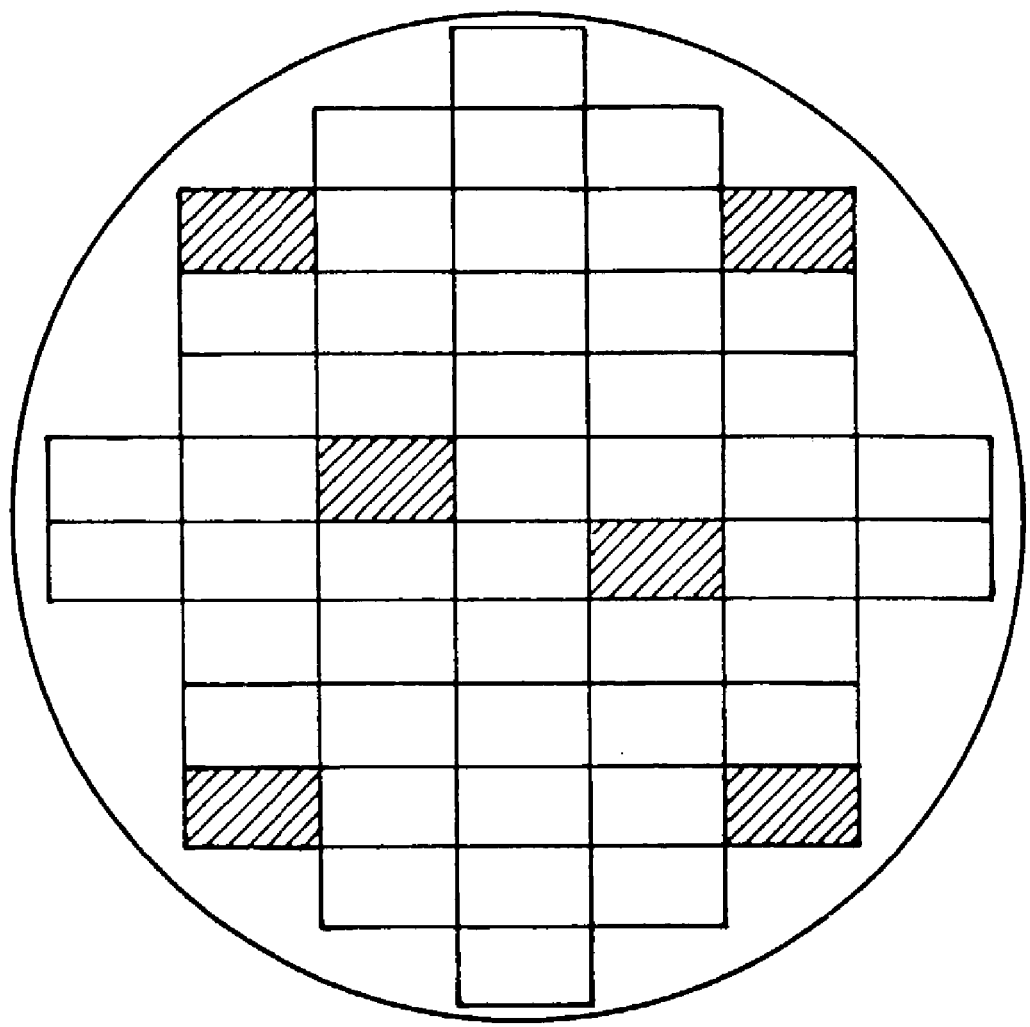
FIG. 7 is a top plan view, for explaining an example of a layout of regions of a wafer to be exposed and selection of sample shots for which pre-scan is made in this embodiment of the present invention.
Figure 8:
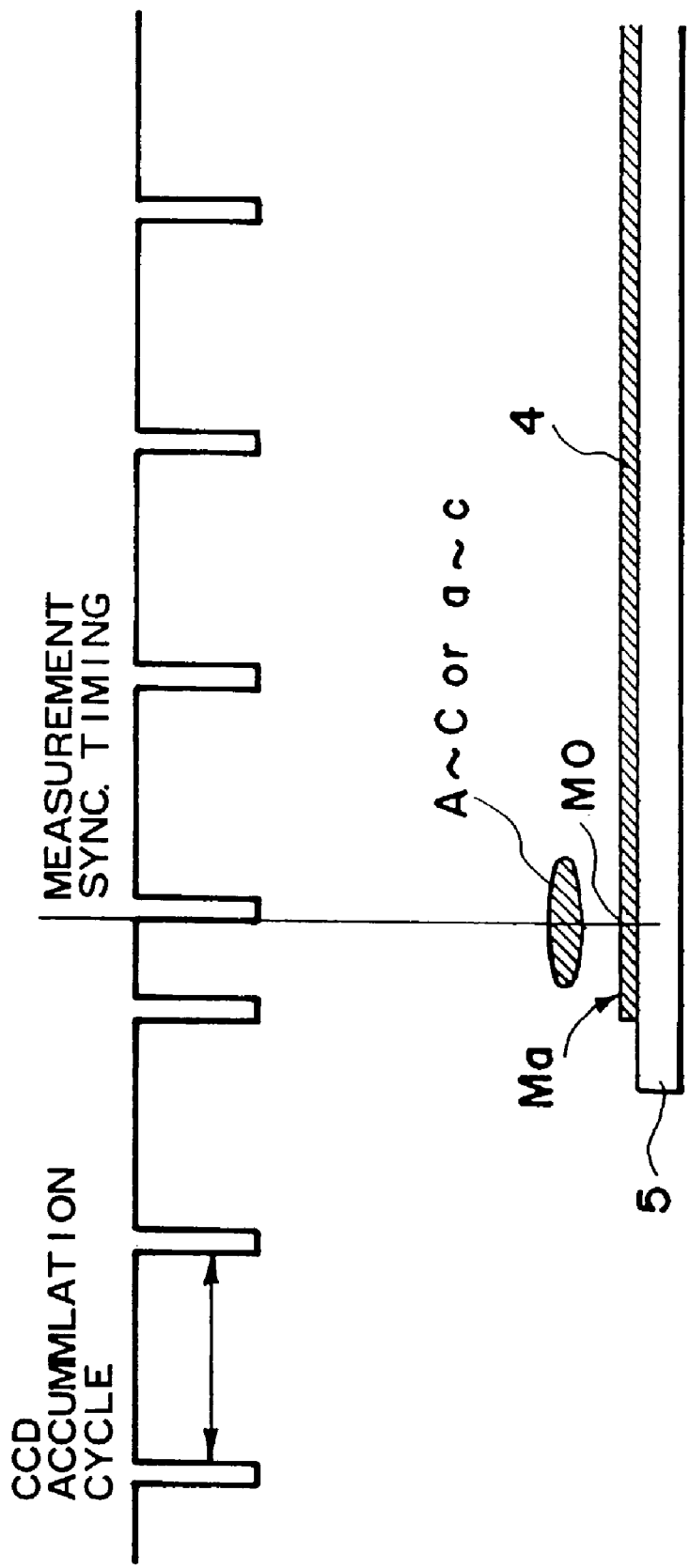
FIG. 8 is a schematic view for explaining a position on a wafer and an accumulation cycle of a CCD sensor.

In FIG. 4, the incidence angle ø upon the wafer 4 surface of each light flux from the light projecting means (the angle with respect to a normal to the wafer surface, that is, with respect to the optical axis) is not less than 70 deg. As shown in FIG. 7, there are a plurality of pattern regions (exposure region shots) on the wafer 4 surface, disposed in an array. The seven light fluxes passing the lens system 13 impinge on separate measurement points in the pattern region, as shown in FIG. 5, and they are imaged there. Also, each light is projected in a direction rotated by an angle θ (e.g., 22.5 deg.) from the Y direction (scan direction) and within the X-Y plane, so that the seven measurement points can be observed independently upon the wafer 4 surface.

With the arrangement described above, the components are spatially disposed appropriately and high precision detection of surface position information is facilitated.

Next, the side for detecting reflection light from the wafer 4, that is, elements 15–19, will be explained. Denoted at 16 is a light receiving lens which comprises a dual telecentric system. It serves to receive seven reflection lights from the wafer 4 surface, coming via a mirror 15. There is a stopper 17 disposed within the light receiving lens 16. It is provided in common to the seven measurement points, and it serves to block higher order diffraction light (noise light) produced by a circuit pattern having been formed on the wafer 4. The lights passing through the light receiving lens 16 of the dual telecentric system have their optical axes parallel to each other, and they are re-imaged upon a detection plane of photoelectric converting means group 19 to define light spots of the same size thereon. In the light receiving side (elements 16–18), tilt correction is made so that the measurement points on the wafer 4 surface and the detection plane of the photoelectric converting means group 19 are placed in an optically conjugate relation with each other. Thus, any local inclination at respective measurement points does not cause a shift of the position of a pinhole image upon the detection plane, such that the pinhole image displaces upon the detection plane in response to a change in level at each measurement point, with respect to the optical axis direction AX.

The photoelectric converting means group 19 comprises seven one-dimensional CCD line sensors. This provides advantages over a conventional structure using one two-dimensional sensor, in the following points. First, in the construction of the correction optical system group 18, separation of the photoelectric means facilitates the latitude of disposition of various optical components and mechanical holders. Also, while the optical magnification from the mirror 15 to the correction optical system group 19 should be made large to improve the resolution of detection, in this respect, too, separating the light paths toward respective sensors enables compact structure of components. Further, in a slit scan type, it is inevitable to perform continuous focus measurement during the exposure process, and reduction of measurement time is an important factor to be satisfied. With the use of a two-dimensional CCD sensor, while it may be attributable to reading-out of excessive data than is required, it takes a long read-out time of ten times or more than is required by a one-dimensional CCD sensor.

Next, an exposure system of a slit scan type will be explained.

As shown in FIG. 4, the reticle is attracted and held by the reticle stage 3. The reticle is then scanningly moved at a constant speed in an RY direction (Y-axis direction) within a plane perpendicular to the optical axis AX of the projection lens 1. Also, with regard to the RX direction (X-axis direction, perpendicular to the sheet of the drawing), correction drive is made so that a target coordinate position is scanned constantly. The positional information of the reticle stage in the X and Y directions is continuously measured, by projecting plural laser beams from an outside reticle interference system (XY) 21 to an X-Y bar mirror 20 which is fixed on the reticle stage 3 of FIG. 4.

Exposure illumination optical system 6 uses a light source such as an excimer laser which provides pulsed light. It comprises a beam shaping optical system, an optical integrator, a collimator and a mirror, for example, which are not shown in the drawing. It is formed by a material efficiently transmitting or reflecting pulse light in the deep ultraviolet region. The beam shaping optical system serves to adjust the sectional shape (including size) of a received light beam into a desired shape. The optical integrator servers to make uniform the light distribution characteristic so that the reticle 2 is illuminated with uniform illuminance. By means of a masking blade (not shown) within the exposure illumination optical system 6, a rectangular illumination region 30 (FIG. 5) corresponding to the chip size is set. The pattern on the reticle 2 in a portion as illuminated with this illumination region is projected through the projection lens 1 onto the wafer 4, which is coated with a resist.

Main control unit 27 shown in FIG. 4 controls the whole system such that the scan exposure is performed while the position of the slit image of the reticle 2 in a predetermined region of the wafer 4, along the X-Y plane (X and Y positions as well as rotation θ about an axis parallel to the Z axis) and with respect to the Z-direction position (rotations α and β about axes parallel to the X and Y axes, respectively, and height Z along the Z axis) is adjusted. More specifically, as regards alignment of the reticle pattern with respect to the X-Y plane, control data is calculated from position data as obtainable from the reticle interferometer 21 and the wafer stage interferometer 24 and position data of the wafer obtainable from an alignment microscope (not shown), and a reticle position control system 22 and a wafer position control system 25 are controlled.

When the reticle stage 3 is scanned in a direction of an arrow 3a in FIG. 4, the wafer stage 5 is scanned in a direction of an arrow 5a at a speed corrected by an amount corresponding to the reduction magnification of the projection lens. The scan speed of the reticle stage 3 is determined on the basis of the width of the masking blade (not shown), in the scan direction, within the exposure illumination optical system 6 and the sensitivity of the resist applied to the wafer 4 surface, for advantages to the throughput.

The alignment of the pattern on the reticle with respect to the Z-axis direction, that is, registration of it with the image plane, is performed on the basis of the result of calculations by the surface position detecting system 26, which detects the height data of the wafer 4, and by controlling the leveling stage of the wafer stage with the use of the wafer position control system 25. More specifically, from the level data at three points of wafer level measurement light spots disposed before and adjacent to the slit with respect to the scan direction, tilt with respect to a direction perpendicular to the scan direction as well as height with respect to the optical axis AX direction are calculated, and the amount of correction toward the optimum image plane position at the exposure position is detected.

In the apparatus of FIG. 4, the accumulation timing of the CCD sensor is reset with the timing of measurement start. As for a method of synchronization of accumulation start, any of a command reception method and a hard wire synchronism method may be adopted.

More specifically, at each shot, as shown in FIG. 5, after a scan start of the wafer stage 5, as the wafer stage moves to the start point (focus measurement enabled position) Ma of that shot and, additionally, spots A–C or a–c come to the first measurement point M-0 (FIG. 6), the accumulation cycle of the CCD sensor is initialized on the basis of the position data of the wafer stage interferometer 24, by which the synchronism of an image is assured. In this manner, even in the course of the accumulation cycle, the accumulation cycle is refreshed with a measurement start trigger, and the position of the wafer 4 and the measurement timing of the CCD sensor are synchronized with each other. This assures that even during the scan for exposure or scan for offset measurement, the focus measurement is performed with the same point in the chip or shot constantly, such that the focus measured value during scan exposure can be corrected precisely with an offset value having been measured with respect to the same position. Thus, high precision focus correction is enabled.

Figure 9:
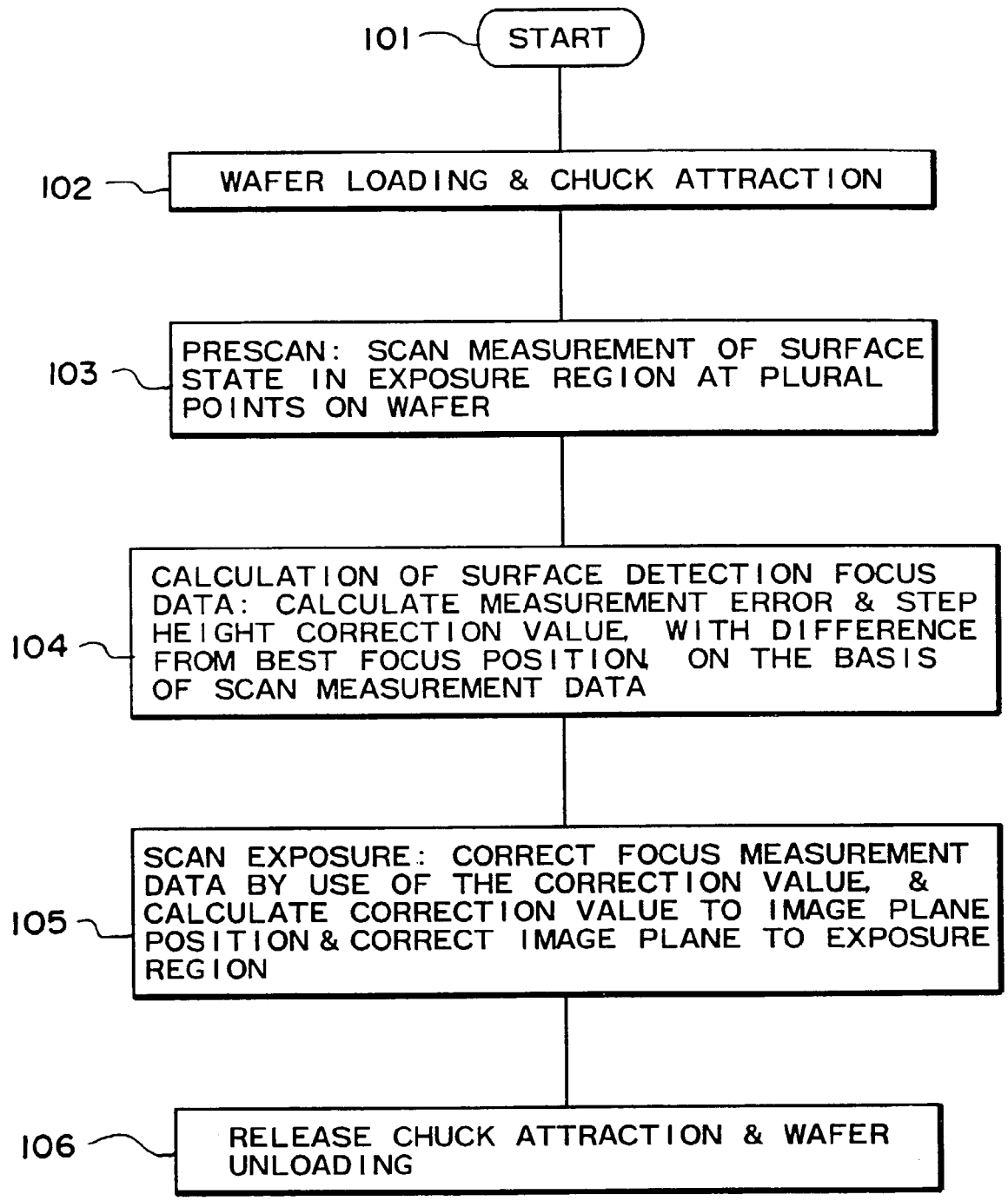
FIG. 9 is a flow chart for explaining a sequence from wafer loading to wafer unloading, in the apparatus of FIG. 4.

Referring now to the flow chart of FIG. 9, a method of detecting the surface position in an exposure region of the wafer 4 in accordance with the surface position detecting method of the present invention, will be explained. At step 101, a start signal is received and, at step 102, a wafer is loaded onto the stage. It is attracted and held by the stage. After this, for measurement of the surface shape (surface positions at plural points) in the exposure region of the chip, at step 103, the prescan measurement (detection of surface position at plural locations in each exposure region while actually scanning it) to particular sample shot regions as depicted by hatching in FIG. 7 is performed. Thereafter, at step 104, measured surface position detected values are used to calculate a correction value (error dependent on the pattern structure) for correcting the measured value during the scan exposure toward the distance to the optimum exposure image plane position. After calculation of a correction value is completed, at step 105, the scan exposure sequence at each exposure position is executed. In other words, the detected value of surface position at each detection point for detection of the surface position is corrected by the correction value, corresponding to the pattern structure of the detection point, and focus correction amount calculation and correction drive for registration of the exposure region with the exposure image plane are performed on the basis of the corrected surface position detected value.

The correction value as obtained through the pre-scan measurement depends on the pattern structure (actual surface step within the exposure region or material of the substrate surface, for example). Since it is considered that wafers of the same lot or wafers having been treated by the same process have the same pattern structure, the correction value obtained with respect to at least the first wafer may be applicable to the remaining wafers. Performing the pre-scan measurement only to the first one or ones of the wafers in the same lot is effective to increase the throughput significantly.

A slit scan type projection exposure apparatus which uses a surface position detecting method according to a second embodiment of the present invention may have the same structure as that shown in FIG. 4.

The light adjustment sequence in the surface position detecting method of this embodiment will be explained with reference to the flow chart of FIG. 10.

First, at step 201, measurement positions (detection points) within the shot as well as sample shots are determined on the basis of chip size, layout and exposure conditions, for example. As for the sample shots, those depicted with hatching in FIG. 7 may be selected, for example. Subsequently, at step 202, an initial value (mean) of a focus illumination light quantity is set. Then, at step 203, a wafer is loaded onto the stage and, at step 204, prealignment is performed. At step 205, focus (Z) correction is performed to the sample shot determined as above. After it, pre-scan measurement is performed to detect an optimum light quantity for measurement of surface position, at plural points in the exposure region of the chip.

In the pre-scan measurement, at step 206, the stage is moved to the scan start position and, at step 207, the scan starts. Subsequently, at step 208, a discrimination is made whether the current spot position is the focus measurement position or not. If it is the focus measurement position, at step 209, the light adjustment data is measured on the basis of an output signal from the CCD sensor 19, and an optimum exposure amount is calculated. If it is not the focus measurement position, then processing at step 209 is skipped. Then, the sequence goes to step 210. At step 210, a discrimination is made as to whether the scan within the shot is completed or not. If it is not completed, the sequence goes back to step 208, and the procedure at steps 208–210 is repeated. If the scan in the shot is completed, the sequence goes to step 211, and the scan is stopped. At steps 212 and 213, the light adjustment data measured value at the respective focus measurement positions, having been measured at step 209, is checked. For this checking, the light adjustment data measurement is made on the basis of the calculated optimum light quantity, and a discrimination is made as to whether the respective light adjustment data measured values are within a tolerance or not. If the tolerance of all the measured positions is OK, the sequence goes to step 214, and the light adjustment sequence is finished. If, on the other hands, the tolerance at any of the measurement positions is not good, the sequence goes back to step 206, and the procedure at steps 206–213 is repeated. It is to be noted that in the tolerance check at the second and later tolerance checking operations, further scan measurement is not performed unless the sensor output is saturated or the peak is lowest.

Figure 11:
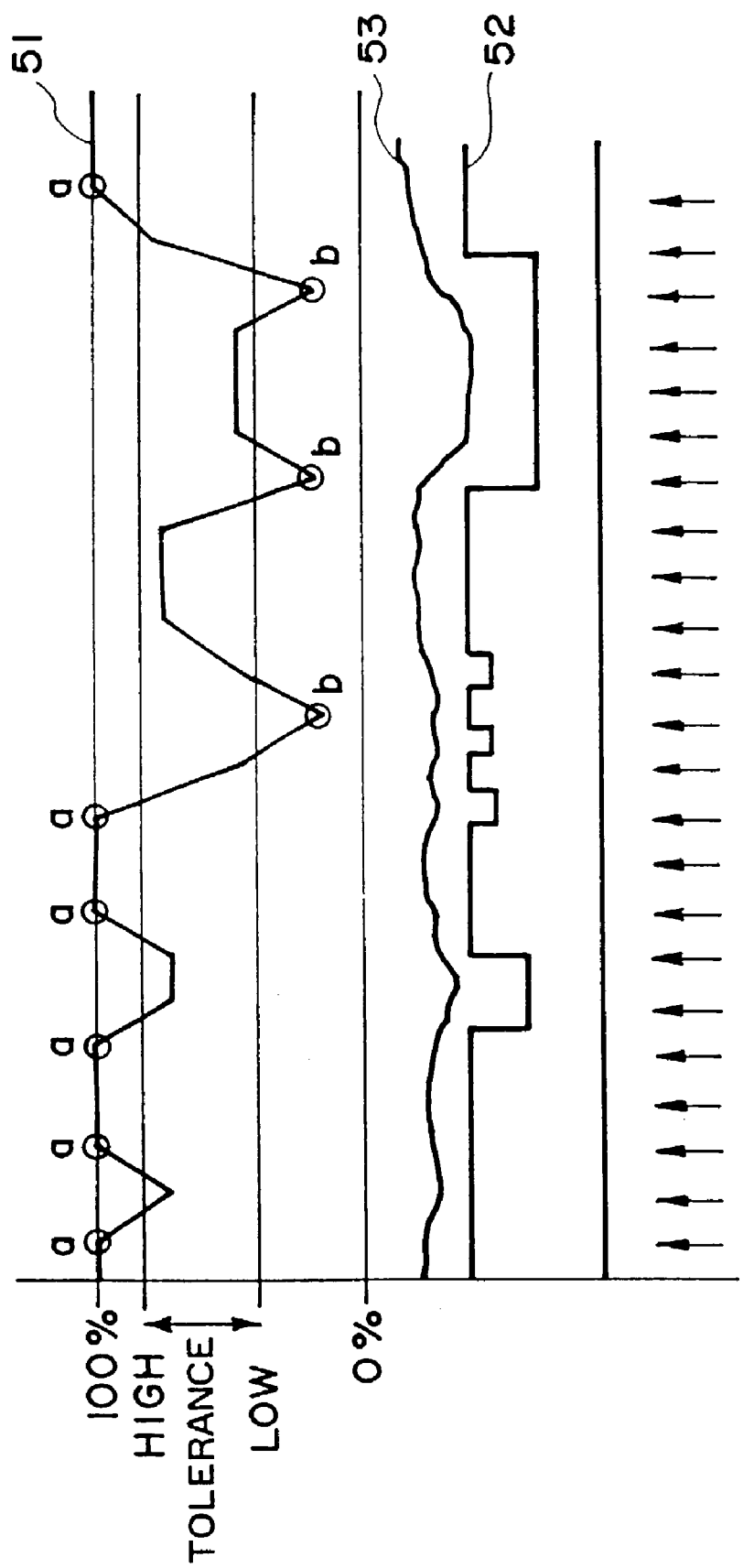
FIG. 11 is a schematic view for explaining an example of a relation between the wafer surface and an optimum light quantity obtainable with the light adjustment sequence of FIG. 10.
Figure 12A:
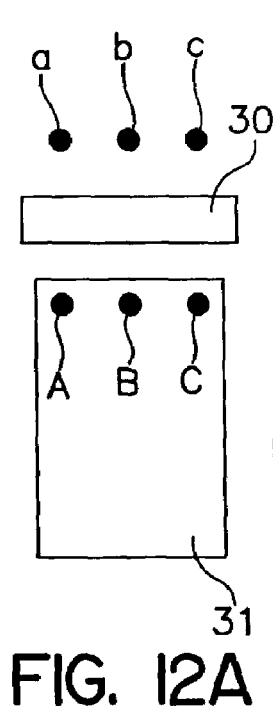
FIGS. 12A–12D are schematic views for explaining an example of measurement data check processing, in the light adjustment sequence of FIG. 10.
Figure 12B:
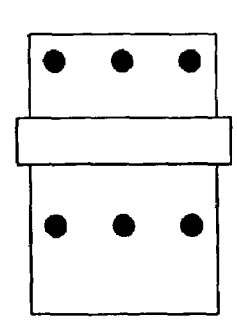
Figure 12C:
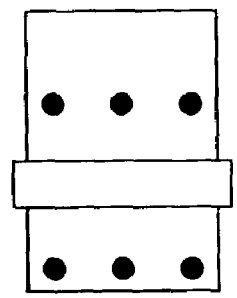
Figure 12D:
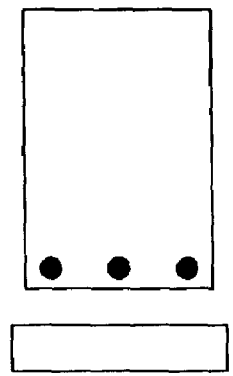

FIG. 11 is a graph showing a detected light quantity, obtained. In this drawing, denoted at 51 is the detected light quantity, and denoted at 52 is the surface of the wafer 4. Denoted at 53 is a resist applied to the wafer 4. An arrow represents the focus measurement position.

Detected light quantity 51 is larger in a flat portion (e.g., at a) of the resist surface, and it is smaller in an irregular portion or slant portion (e.g., at b) due to the effect of scattering. If a tolerance of LOW and HIGH is set for the light quantity as shown in FIG. 11, at the positions a and b, the quantity is out of the tolerance. Thus, an optimum illumination light quantity may be calculated in accordance with the following equations:

$$NEW=OLD/PEAK\times(LOW+HIGH)/2$$

where OLD is a present set electric current, PEAK is a detected light quantity, (LOW+HIGH)/2 is a target light quantity, and NEW is an optimum drive current.

If the detected light quantity PEAK is saturated, a real PEAK cannot be determined. On that occasion, a new drive current NEW may be set to a half or one-third of the present light quantity, by which the number of loops can be reduced. Also, even for a measurement position where the tolerance is OK, an optimum drive current as determined in accordance with the equation above may be calculated. This enables that detection waveforms at respective measurement points during scan exposure become constant, and variation of the measured value can be suppressed.

The apparatus of FIG. 4 may use a light emitting diode (LED) for the light source 10, and the light receiving means may comprise one-dimensional CCD sensors. During the prescan at steps 207 and 211, as shown in FIGS. 12A–12D, while upwardly scanning a sample shot 31, light adjustment data (CCD sensor output) is measured with regard to six spots of a, b, and c and A, B, and C. The initial electric current value during the prescan is determined on the basis of a first measured value (push-up detection) and, in a later stage during the prescan, Z (height of wafer stage) and LED electric current value are held constant. In the measured value checking at step 212, the sample shot 31 is upwardly scanned and an optimum light quantity at respective measurement positions is calculated and memorized. After that, the scan is switched to downward scanning, and during that scan, the light quantity of the LED 10 is controlled to an optimum light quantity as having been calculated and memorized with respect to the respective measurement positions. Light adjustment data with respect to the six spots a, b, and c and A, B, and C is measured at the same time, and a discrimination is made as to whether the light adjustment data is within the tolerance or not.

During a scan exposure operation, for upward scan, the light quantities at spots A, B and C are adjusted to an optimum light quantity as obtained through the light adjustment sequence described above, and a CCD sensor is reset. Then, the surface position (focus) of the wafer at the spots A, B and C is measured (antecedent reading). For downward scan, on the other hand, the light quantity at spots a, b, and c is adjusted to the optimum light quantity as obtained through the light adjustment sequence described, and focus of the spots a, b, and c, is measured (antecedent reading). Then, on the basis of a value obtained by correcting the measured values through offset correction, the height and attitude of the wafer are calculated and focus correction is performed. Practically, after focus detection, light quantity setting (drive current and gain change) at a just next measurement point may be made, this being effective for measurement at a short interval.

Figure 10:
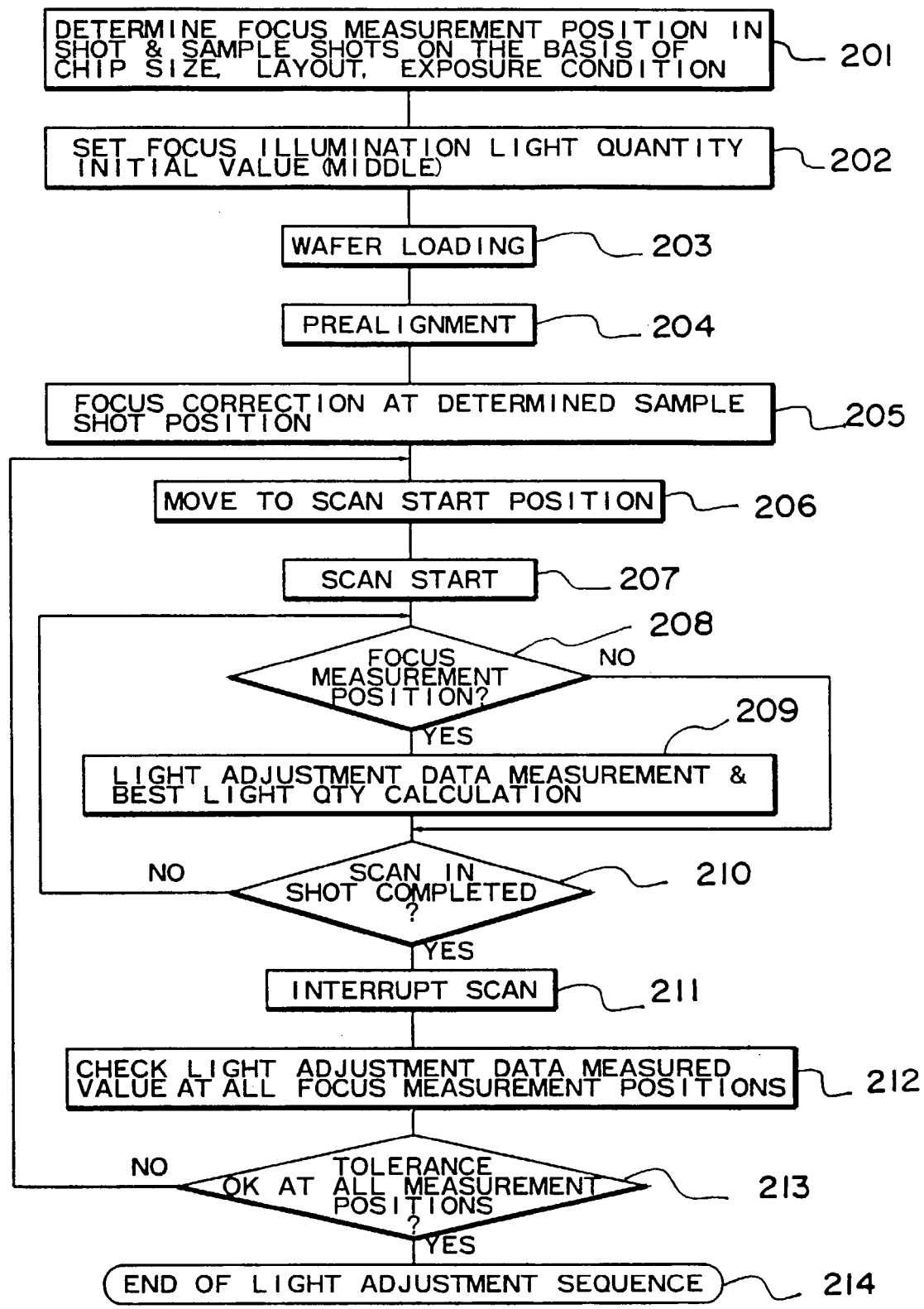
FIG. 10 is a flow chart of a light adjustment sequence, in a second embodiment of the present invention.

FIGS. 13A–13D show another example of a measured value checking at step 212 of FIG. 10. In these figures, subsequent to the sample shot 31, a next shot 33 is scanned upwardly and light adjustment data measurement and optimum light quantity calculation for spots a, b, c and A, B and C are performed by use of the sample shot 31. The checking of light adjustment data is made by use of the sample shot 33.

In the first example of this embodiment, discrimination of light adjustment data needs, after one scan, the operation of deceleration, stoppage and reversed acceleration and scan. However, in this example of the present embodiment, while the scan length is twice, the light adjustment data can be checked with one scan only. Thus, the time for the light adjustment sequence can be reduced.

Figure 14A:
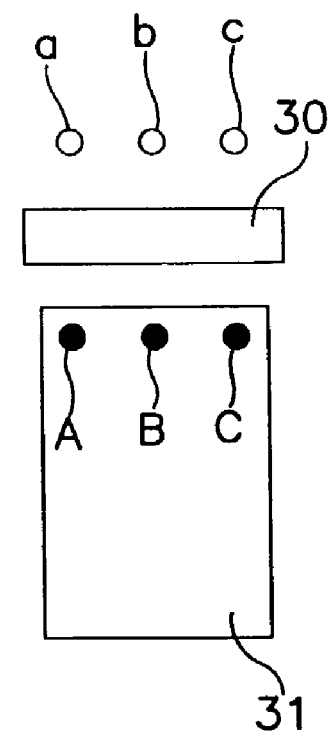
FIGS. 14A–14C are schematic views for explaining a further example of measurement data check processing, in the light adjustment sequence of FIG. 10.
Figure 14B:
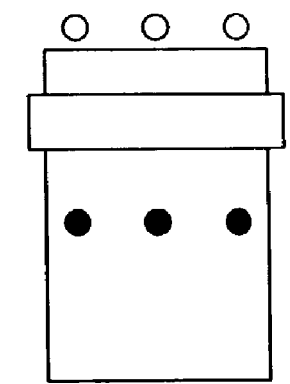
Figure 14C:
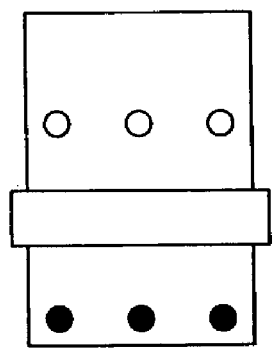

FIGS. 14A–14C show another example of a measured value checking at step 212 of FIG. 10. This example is suitable for measurement of light adjustment data for a surface having no reflectivity difference or a plane surface having no irregularity, as in the case of a bare Si substrate. A difference in sensitivity (sensor output under the same drive current and the same reflectivity) among spots A, B, and C and a, b, and c may be statistically measured beforehand. Light adjustment data may be measured in regard to spots A, B and C, while checking of the light adjustment data may be made in regard to spots a, b and c. The optimum light quantity for spots a, b and c, may be determined by calculation, on the basis of measured data of spots A, B and C, while taking into account the sensitivity difference. In this example, as compared with the preceding example, the processing time for a light adjustment sequence can be reduced further. Also, as compared with the preceding example, it is not necessary to measure the light adjustment data for the spots a, b and c and spots A, B and C simultaneously. Thus, the processing circuit can be made simple.

While in the foregoing examples, the light quantity of light projecting means is controlled on the basis of light adjustment data, a gain of the light receiving means may be adjusted.

In a scanning exposure apparatus according to a third embodiment of the present invention, effectiveness/ineffectiveness information related to focus measurement active channels (plural measurement locations per each sensor) during the exposure operation may be determined beforehand, on the basis of wafer size, shot size, chip size, ineffectiveness range, exposure condition, for example. The focus measurement sample channels during the scan may be switched dynamically on the basis of the information, and data of height with respect to the direction (optical axis) of the projection lens as well as tilt may be produced.

The scan direction for each shot is set by use of effectiveness information of the focus sensor, so that the scan is made from one with a larger number of effective sensors to one with a smaller number of effective sensors. On that occasion, for a shot (e.g., rectangular portion) in which the number of effective channels is the same for all measurement ranges, while taking into account that deformation of the wafer may be symmetrical with respect to the center, the layout may be determined so that movement is made to a shot closest as much as possible.

With the structure described above, when the surface position of a wafer with a pattern is detected continuously while relatively scanning the same, focus effectiveness/ineffectiveness during the scan measurement is discriminated beforehand on the basis of the layout information of the wafer or chips. Focus measurement sensors are dynamically switched during the scan exposure on the basis of that information, and focus measurement and correction are performed. In other words, measured values of those sensors whose measurement positions are out of the sensor surface, as a result of a non-rectangular shape of the shot, are not used. This effectively prevents focus measurement error, and avoids interruption of operation due to such an error or increase of processing time and synchronization delay with a correction system.

Further, weighting may be made to measured values in accordance with the positional relation between the sensor and shot, and it enables focus detection with higher precision.

It is desirable that an effective measured value of a current shot and/or effective measured value of a preceding shot is used to perform high precision focus correction. That is, with the scan in a direction from a side with a larger number of effective sensors to a side with a smaller number of effective sensors on the basis of the sensor effectiveness information obtained with the discrimination method described above, high precision focus correction is assured even in a region with a small number of sensors.

Figure 15:
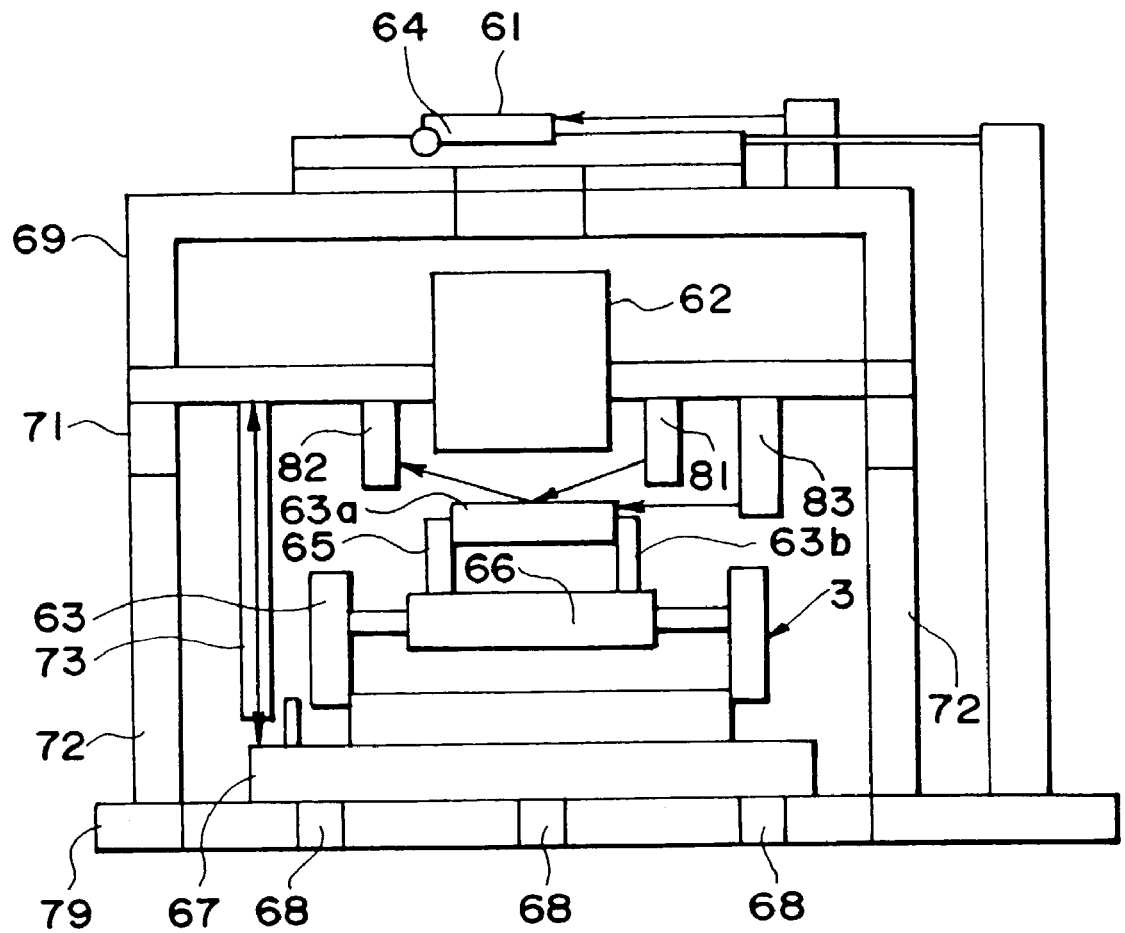
FIG. 15 is a schematic and side view of an exposure apparatus according to a third embodiment of the present invention.
Figure 16:
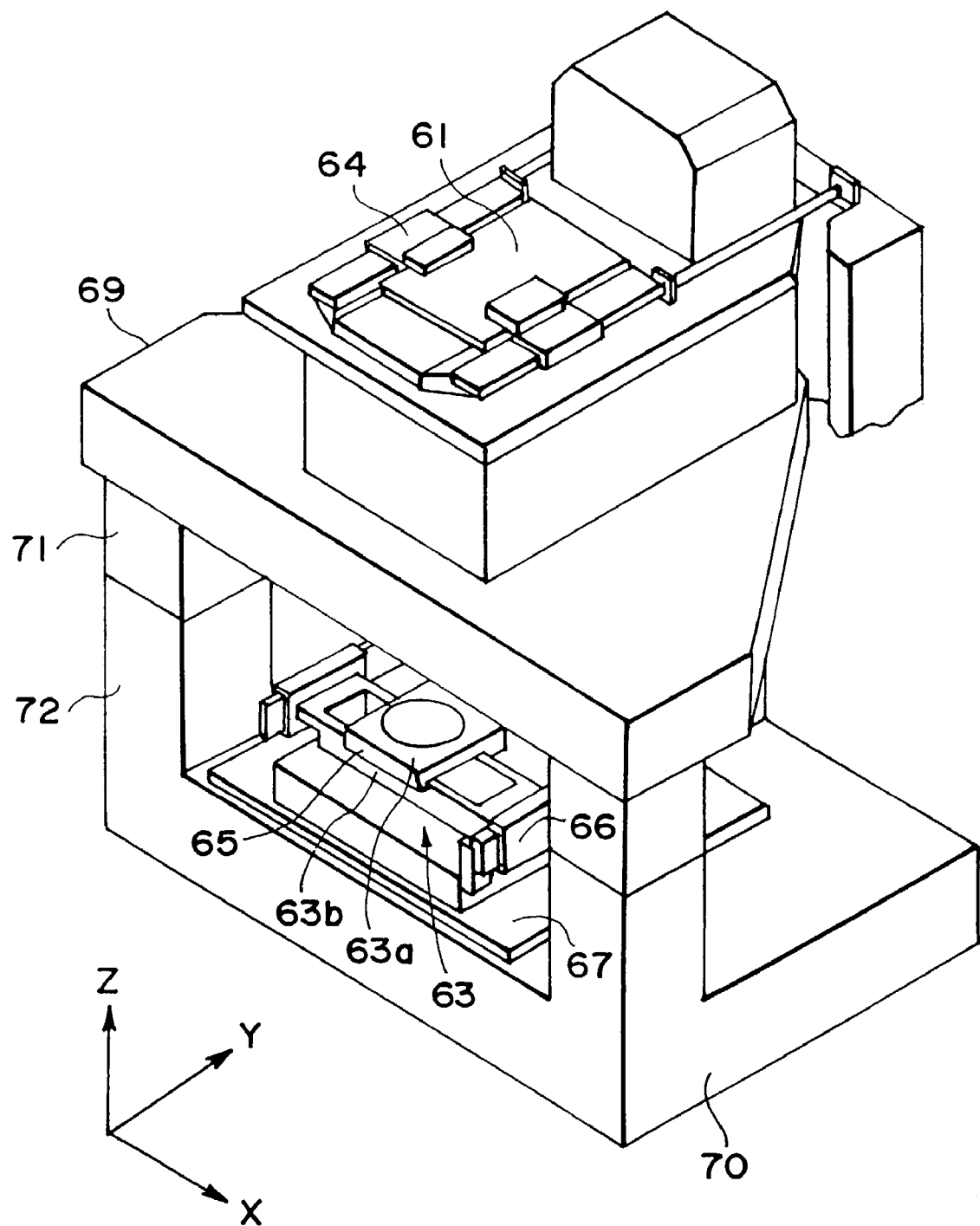
FIG. 16 is a schematic and perspective view of the exposure apparatus of FIG. 15.

Examples of the third embodiment will now be explained with reference to the drawings. FIG. 15 is a schematic and side view of an exposure apparatus according to this embodiment of the present invention. FIG. 16 is a perspective view of the exposure apparatus. As shown in these drawings, this exposure apparatus is a step-and-scan type exposure apparatus in which a portion of a pattern of an original placed on a reticle stage 61 is projected onto a wafer placed on an X-Y stage 63 through a projection optical system 62, and the reticle and the wafer are scanningly moved in the Y direction simultaneously relative to the projection optical system 62 whereby the pattern of the reticle is transferred onto the wafer. Also, such a scan exposure is repeated to plural regions (shots) on the wafer and, to this end, stepwise motion is made during the operation.

The reticle stage 61 is moved in the Y direction by a linear motor 64, and X stage 63a of the X-Y stage 63 is moved in the X direction by a linear motor 65. Y stage 63b of the X-Y stage is moved in the Y direction by a linear motor 66. The synchronous scan of the reticle and the wafer is performed by moving the reticle stage 61 and the Y stage 63b in the Y direction at a constant speed ratio (e.g., 4:−1)(the sign "−" means that the direction is reverse). Also, stepwise motion in the X direction is made by means of the X stage 63a.

The X-Y stage 63 is mounted on a stage base 67, and the stage base 67 is supported on the floor, for example, at three points by means of three dampers 68. The reticle stage 61 and the projection optical system 62 are mounted on a barrel base 69, and the barrel base 69 is supported by a base frame 70, mounted on the floor, for example, through three dampers 61 and pillars 62. The dampers 68 each comprises an active damper for controlling or reducing vibration actively in six-axis directions. However, passive dampers may be used and, alternatively, the component may be supported without a damper.

The exposure apparatus further comprises distance measuring means 73 having a laser interferometer or a micro-encoder, for example, for measuring the distance between the barrel base 69 and the stage base 67 at three points.

Light projecting means 81 and light receiving means 82 constitute a focus sensor for detecting whether the wafer on the X-Y stage 63 is placed on the focus plane of the projection optical system 62. More specifically, the light projecting means 81 fixed to the barrel base 69 projects light to the wafer in an oblique direction thereto, and the position of reflected light from the wafer is detected by the light receiving means 82, whereby the position of the wafer surface with respect to the optical axis direction of the projection optical system 62 is detected.

With the structure described above, a wafer is conveyed by conveying means (not shown) along a conveyance path between two pillars 72 in a front portion of the system and it is loaded on the X-Y stage 63. After a predetermined alignment operation is completed, in the exposure apparatus, scanning exposure and stepwise motion are repeated such that the pattern of the reticle is printed on plural exposure regions on the wafer. During scan exposure, the reticle stage 61 and the Y stage 63b are moved in the Y direction (scan direction) at a predetermined speed ratio, whereby the pattern of the reticle is scanned with slit-like exposure light and, additionally, the wafer is scanned with a projected image thereof. By this, the pattern of the reticle is transferred onto a predetermined exposure region of the wafer. During the scan exposure, the height of the wafer surface is measured by means of the focus sensor as described, and, on the basis of a measured value, the height of the X-Y stage 63 and tilt thereof are controlled in real time, and thus focus correction is performed. After scan exposure with regard to an exposure region is completed, the X stage 63a is moved in the X direction and the wafer is moved stepwise, such that another exposure region is positioned at the scan exposure start position. Then, scan exposure to it is performed. In order that plural exposure regions on the wafer are exposed successively and efficiently with the combination of X-direction stepwise motion and scan exposure movement in the Y direction, disposition of exposure regions and scan direction in the positive or negative Y direction as well as exposure order of the exposure regions are set appropriately.

FIG. 17 shows a positional relation of the slit (exposure slit) projected on the wafer by the projection optical system 62 and focus measurement points (spots) as defined by the focus sensor. FIG. 18 shows focus measurement sample points on the wafer, for which focus measurement is going to be done. In the exposure apparatus of this embodiment, the exposure slit 30 has a size of 7×25 mm, and each exposure region has a size of 25×32.5 mm. There are one spot at the center of the exposure slit 30 and a set of three spots at a distance deviated from the center of the exposure slit 30 in the scan direction; thus, a total of seven spots are there. When the wafer is scanned in a direction from below to above in the drawing, the wafer height (position in the Z direction) is measured by use of three channels of spots A, B and C, with respect to ten points (M0–M9) in the wafer measurement direction, for each spot. When the wafer is scanned from above to below, it is measured by use of three channels of spots a, b, and c. Measurement data is used thereafter as the data for focus correction, when during a further scan of the wafer each measurement point comes to the center of the exposure slit 30.

For a third generation of 64 MDRAM, it is said that the area of one chip becomes smaller than 100 mm². If the area of one chip 100 mm²=7.14 mm, for example, with an exposure region of 25×32.5 mm, 3×2=6 chips (21×28 mm) can be exposed by one shot.

Figure 2:
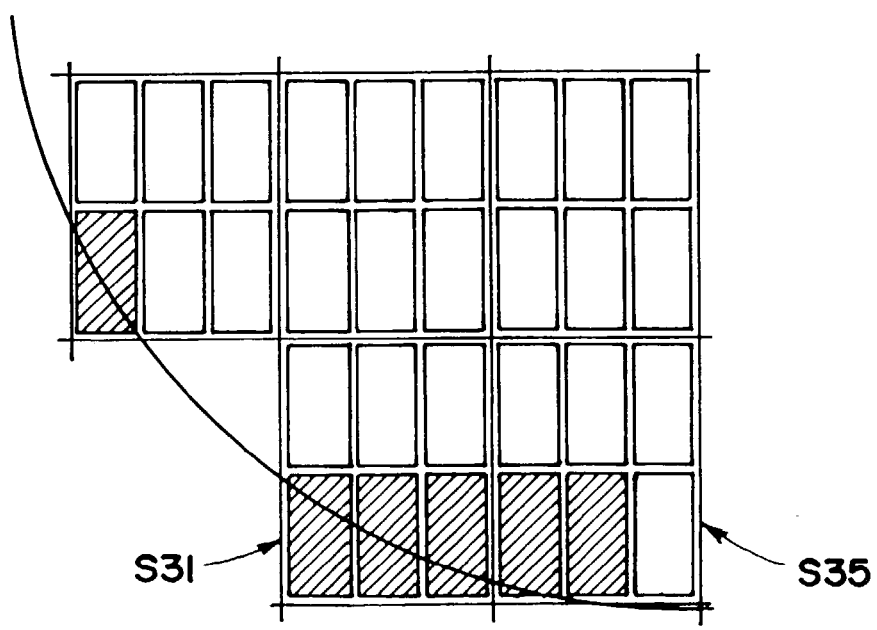
FIG. 2 is an enlarged view of FIG. 1, and for explaining an example of a shot layout on a wafer.

FIG. 1 shows a shot layout on a wafer where one shot covers 3×2=6 chips. In the drawing, those shots as depicted with a hatching denote the shots with a local portion missing. FIG. 2 is an enlarged view of a portion of FIG. 1, and it shows effectiveness/ineffectiveness of each chip in the shot. In FIG. 1, those chips depicted with hatching denote ineffective chips with local portions missing. More particularly, shot S31 has three ineffective chips and three effective chips. Shot S35 has four effective chips inside the shot, and shot S36 has six effective chips inside the shot.

Figure 3:
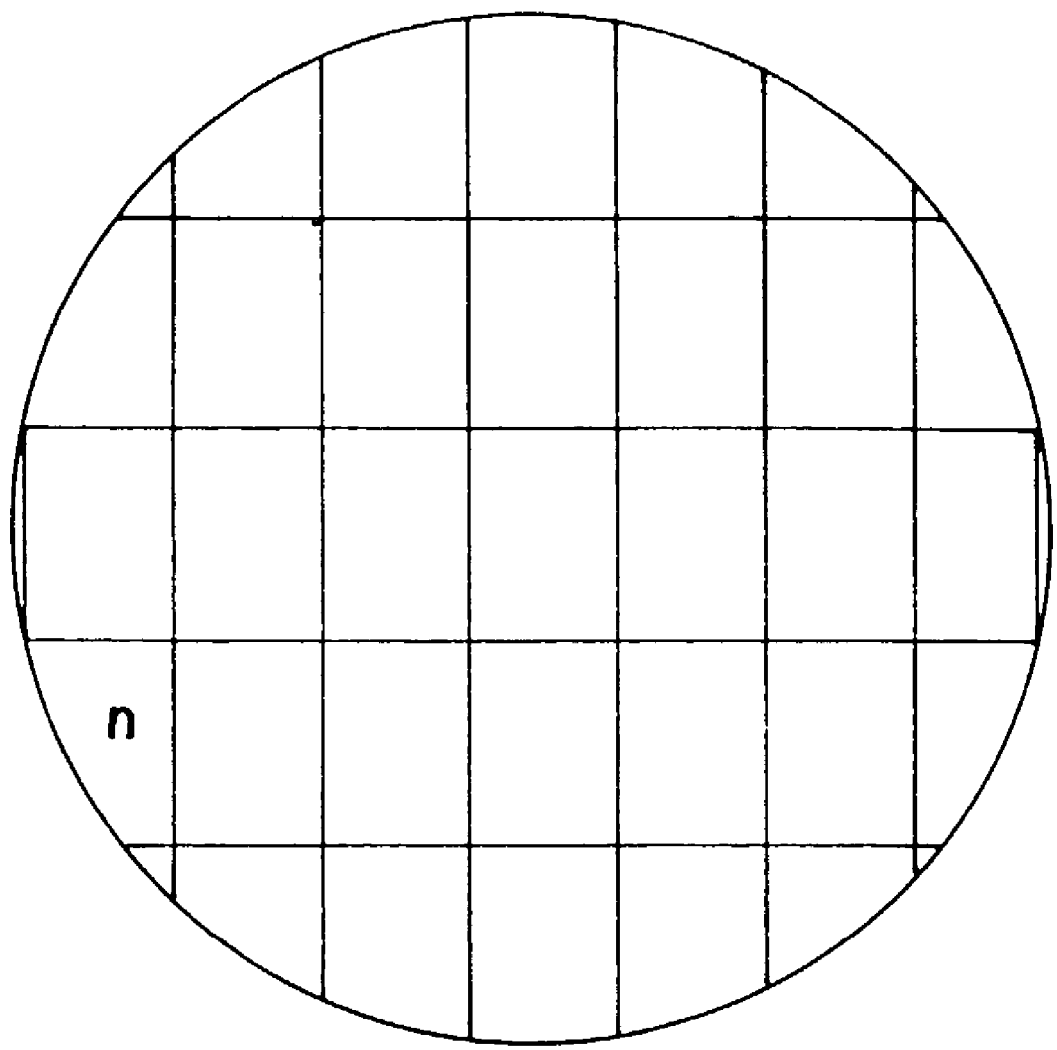
FIG. 3 is a schematic view for explaining another example of a shot layout on a wafer.
Figure 19:
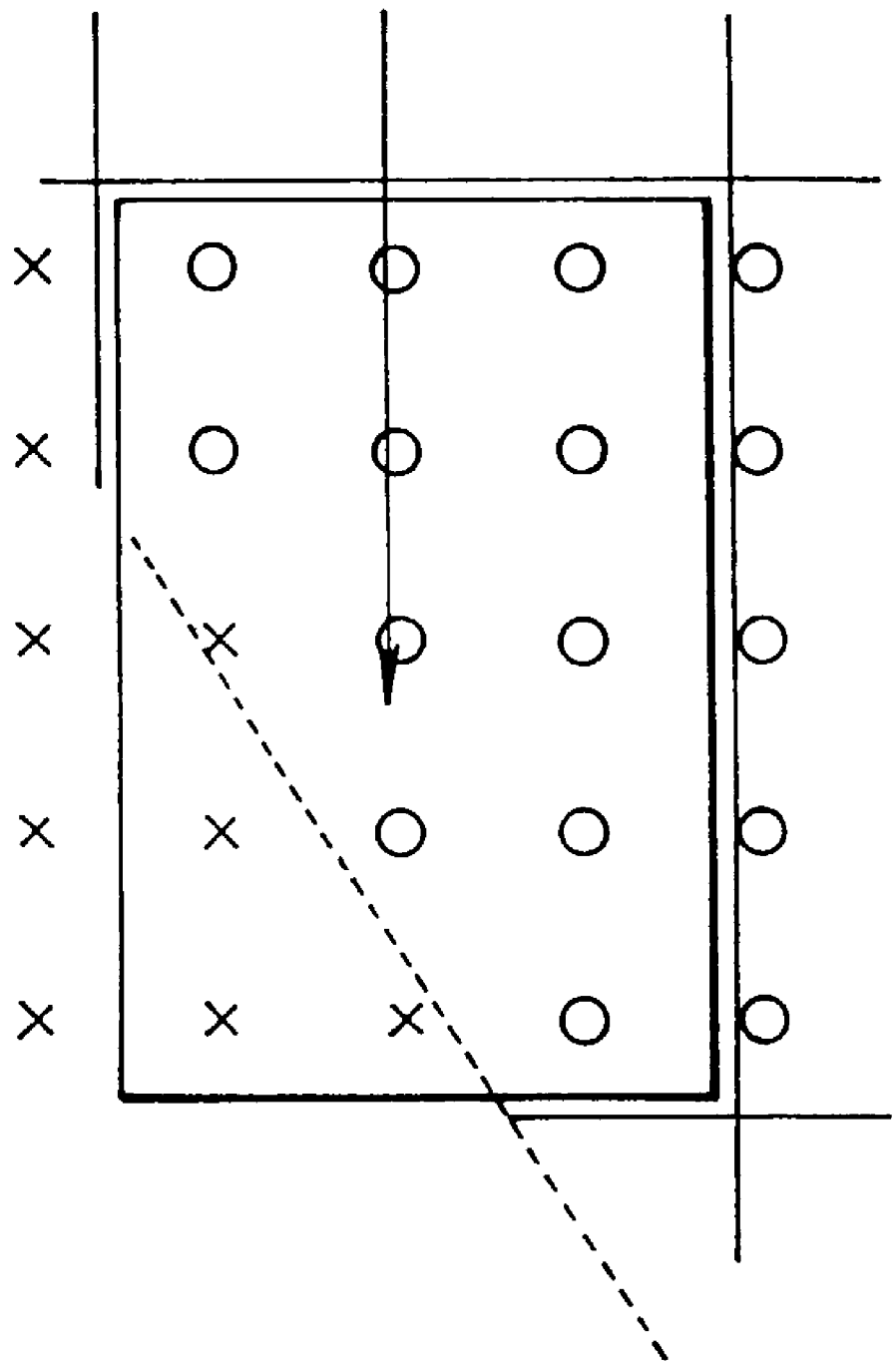
FIG. 19 is a schematic view for explaining measurement positions (spots) of a focus sensor, in the shot layout of the FIG. 3 example.

FIG. 3 illustrates a shot layout on a wafer, and FIG. 19 illustrates effectiveness/ineffectiveness of spot at an n-th shot position in the shot layout of FIG. 3. For a shot with a local portion missing, effective focus measurement is attainable with those spots placed on the wafer. However, with the spots outside the wafer, effective focus measurement is not attainable. In FIG. 19, those denoted by small circles are effective spots, and those denoted by cross marks are ineffective spots. An arrow in the drawing indicates the scan direction of exposure light (slit). While FIG. 17 shows another example wherein spot measurement is made with five channels in one direction. With a conventional focus measurement method, if the spot changes from effective to ineffective, focus error may be caused and the system is interrupted. Focus correction data processing time is prolonged by error processing, and a synchronization delay with the correction system results. The precision of correction is not good.

Figure 20A:
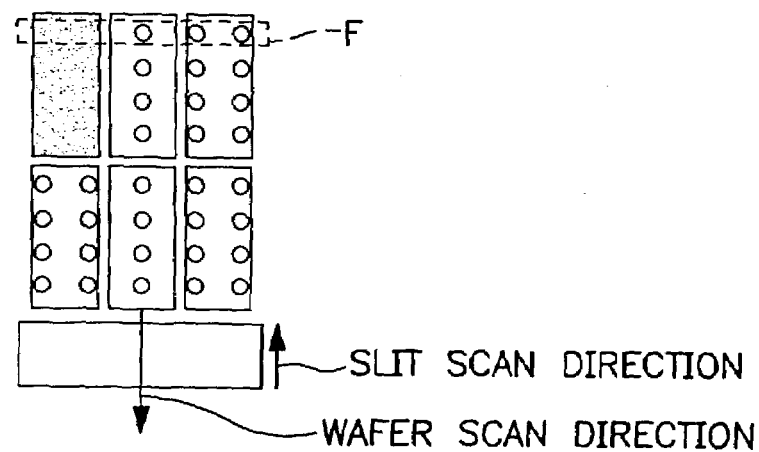
FIGS. 20A–20C are schematic views for explaining another example of focus measurement points in the shot.
Figure 20B:
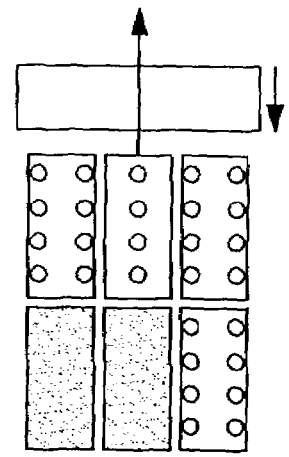
Figure 20C:
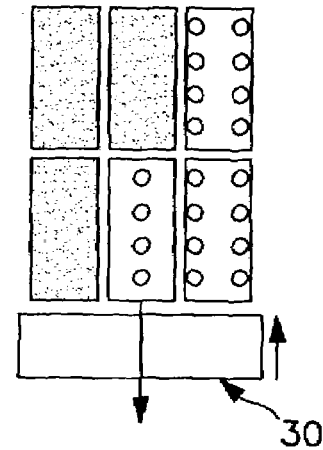

In this embodiment, from the wafer size, shot size, chip size, ineffective range, and exposure condition, for example, effectiveness/ineffectiveness information related to each channel (sensor) during the exposure process such as shown in FIG. 19 or 20A–20C is prepared beforehand, and during the scan exposure, the focus measurement active channels are dynamically switched in accordance with the prepared information, and data of height with respect to the optical axis direction of the projection lens as well as tilt is produced. Then, on the basis of the data, focus correction is performed. FIGS. 20A–20C illustrate, in the structure of one shot with 2×3=6 chips, a case of five effective chips, a case of four effective chips and a case of three effective chips, and show slit and wafer scan direction (arrow) and effective channels (with small circles) for focus measurement during the scan, in these cases. In this example, one sensor array F includes five channels parallel to the lengthwise direction of the slit 30, and eight-point focus measurement is made within the shot. While in this example the effectiveness/ineffectiveness of focus measurement is discriminated in the unit of a chip, a certain range from the outer periphery of the wafer may be regarded as an ineffective area and sensors for measurement to such an ineffective area may be treated as ineffective sensors. On that occasion, effective focus measurement can be done with a larger number of sensors in a wider range, and precision of tilt measurement can be increased.

Figure 21A:
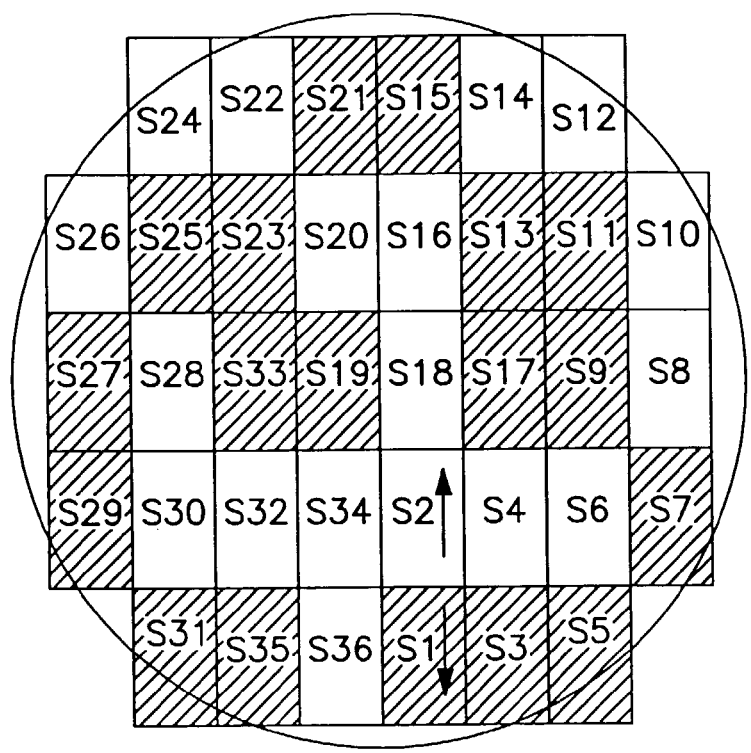
FIGS. 21A–21C are schematic views for explaining an example of an order of exposures.
Figure 21B:
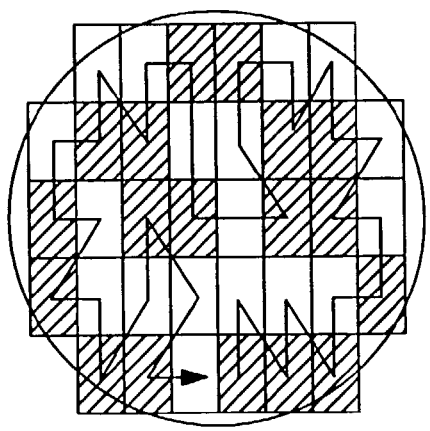

FIGS. 21A and 21B show the scan exposure direction for plural shots and the order of exposures of them. Those shots depicted with hatching represent that they are scanned with an exposure slit from above to below in the drawing (downward scan), while blank shots denote that they are scanned with an exposure slit from below to above (upward scan). The exposures are made in an order of S1, S2, S3, . . . , S35 and S36. In this embodiment, for a shot having an ineffective sensor or sensors, the scan is made from a side with a larger number of effective sensors to a side with a smaller number of effective sensors. This provides an advantage that: for a sensor having a peripheral resist or resist surface irregularity, for example, it is possible that, even if effectiveness has been discriminated, the precision is degraded due to a sudden change in focus measured value. With the scan from a side of a larger number of effective sensors, that is, from a side in which the measured value is stable, higher precision focus measurement is assured. In this embodiment, the scan direction for wafer peripheral shots is not fixed as in a conventional method, that it is from the inside to the outside. Rather, the scan direction is determined on the basis of the number of effective sensors. Thus, for shot S15, S21, or S36 in FIG. 21A, for example, there may be a shot or shots for which the scan direction can be set as desired. Combining it with the symmetry of wafer deformation with respect to the center, the exposure order may be set clockwise or counterclockwise. This provides advantages of (1) smooth movement for scan or stepwise motion at a peripheral portion, and (2) in a case of an irregular surface shape, the number of tilt movement operations within one wafer can be reduced with (with a reduction of an external component).

Figure 21C:

If the wafer has a convex shape as shown in FIG. 21C, the convex shape in the scan direction can be servo-controlled by performing Z (focus) correction plural times within the shot. On the other hand, in regard to the non-scan direction (lengthwise direction of the slit), tilt correction is necessary. When the tilt is corrected, correction of Abbe's error becomes necessary. Thus, a smaller number of corrections is desirable. From this point, exposing a left-hand half and a right-hand half of the wafer separately, with respect to the center of the wafer, as shown in FIGS. 21A and 21B may be preferable. In the illustrated example, the order of exposures is set so that first the shots in the right-hand half of the wafer are exposed and, thereafter, those shots in the left-hand half are exposed.

Figure 22:
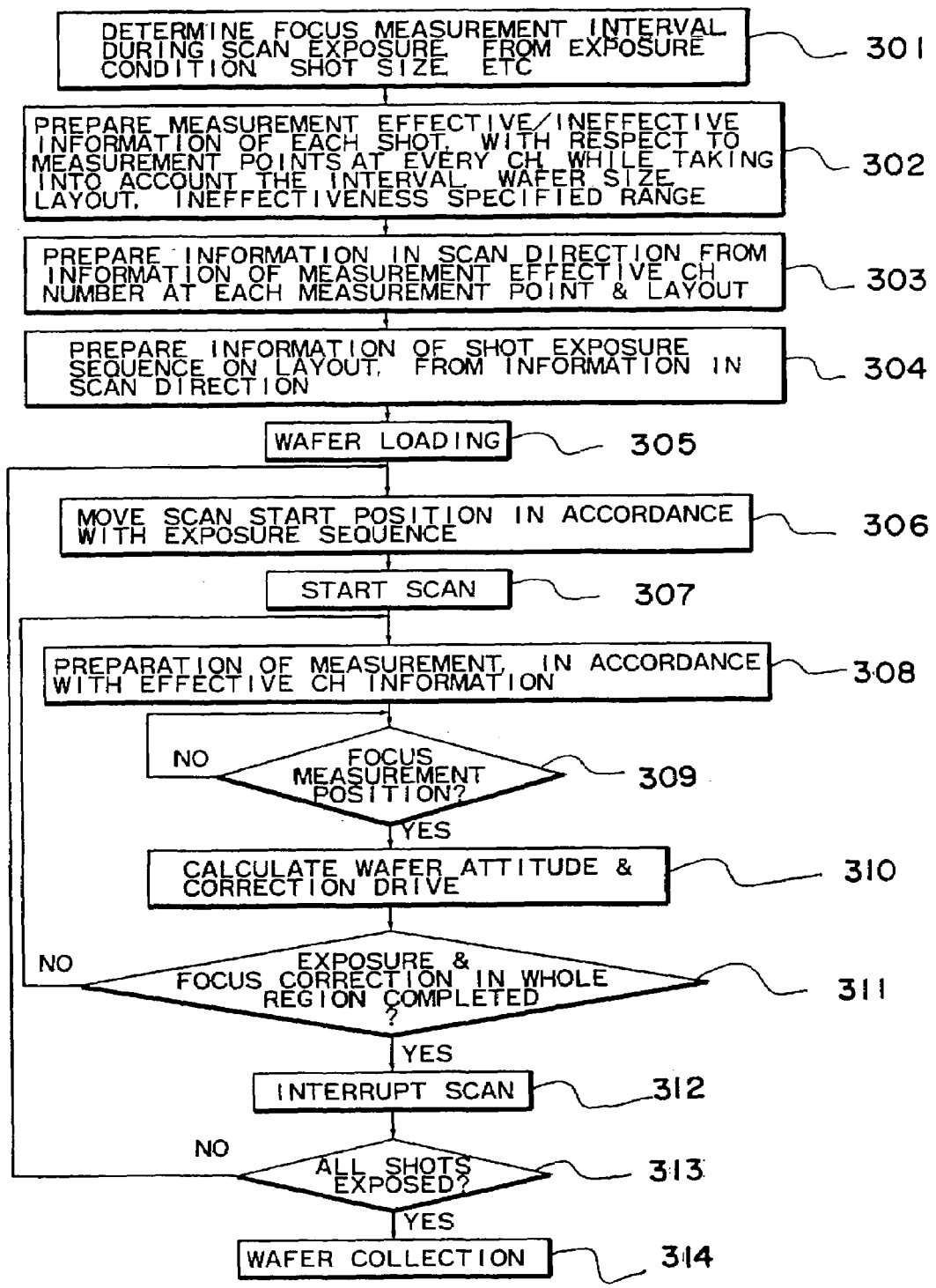
FIG. 22 is a flow chart of an operation in a scan type exposure apparatus according to a third embodiment of the present invention.

Referring to the flow chart of FIG. 22, the operation of a scanning exposure apparatus of FIG. 15 will be explained.

Prior to the exposure operation, the focus measurement interval (that is, focus measurement points) during scan exposure is first determined from an exposure condition and shot size, for example (step 301). Then, at step 302, while taking into account the determined interval, wafer size, layout, and ineffectiveness specified range, for example, measurement effectiveness/ineffectiveness information of each shot is prepared, in relation to each measurement point and each channel (sensor). At step 303, from the layout and the information on the number of effective measurement channels at each measurement point, information related to the scan direction for each shot is prepared. At step 304, from the information of the scan direction, the information related to the order of exposures of the shots in the layout is prepared.

At subsequent step 305, a wafer is loaded and, at step 306, the wafer is moved to the scan start position in accordance with the determined exposure order. At step 307, the scan starts. During the scan operation, at step 307, preparation of measurement is made in accordance with the effective channel information at the subsequent focus measurement point. At step 309, a discrimination is made as to whether the position of the wafer is at a focus measurement point or not. When the wafer comes to a focus measurement point, at step 301, the focus measurement is made, and the attitude of the wafer is calculated on the basis of the focus information from effective channels, only. Then, focus correction drive is done. After the focus correction is completed, at step 311, a discrimination is made as to whether exposure and focus correction have been completed with regard to all the regions in the shot.

If not completed, the sequence goes back to step 308, and the procedures at steps 308–311 are repeated. If completed, in the discrimination at step 311, the scan is interrupted at step 312, and a discrimination is made at subsequent step 313 as to whether exposures of all the shots are completed or not. If not completed, the sequence goes back to step 306, and the procedure at steps 307–312 is repeated to a subsequent shot. If exposures of all the shots are completed, at a discrimination of step 313, the sequence goes to step 314, and the wafer is collected.

In the example described above, as the focus measurement is made at a focus measurement point, the measurement information is instantly used to perform focus correction. This is because the time in which the wafer moves from a spot position to the slit center is the same, in this embodiment, as the sum of the time for attitude calculation and the response delay of the correction system. If it does not apply, the wafer attitude may be calculated and focus correction may be done while taking into account the time necessary for a wafer to move from the spot position to the slit center. Further, if the wafer attitude calculation time and the response delay of the correction system are sufficiently short as compared with the wafer movement time described, focus information at some points between focus measurement points may be determined by complementing calculation, for example, such that focus correction may be done with a pitch smaller than the pitch measurement points.

Figure 23:
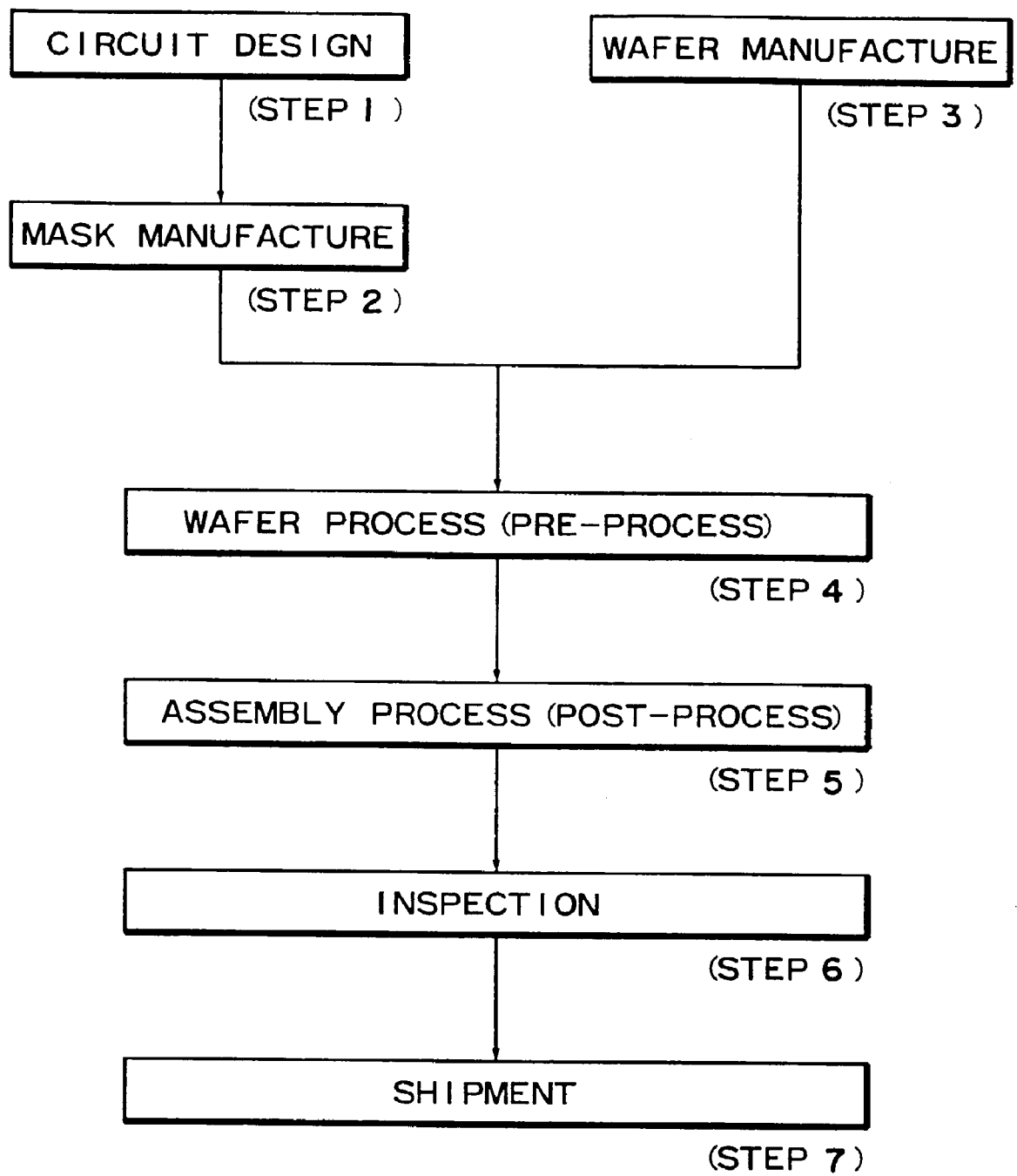
FIG. 23 is a flow chart of a microdevice manufacturing procedure.

FIG. 23 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 24:
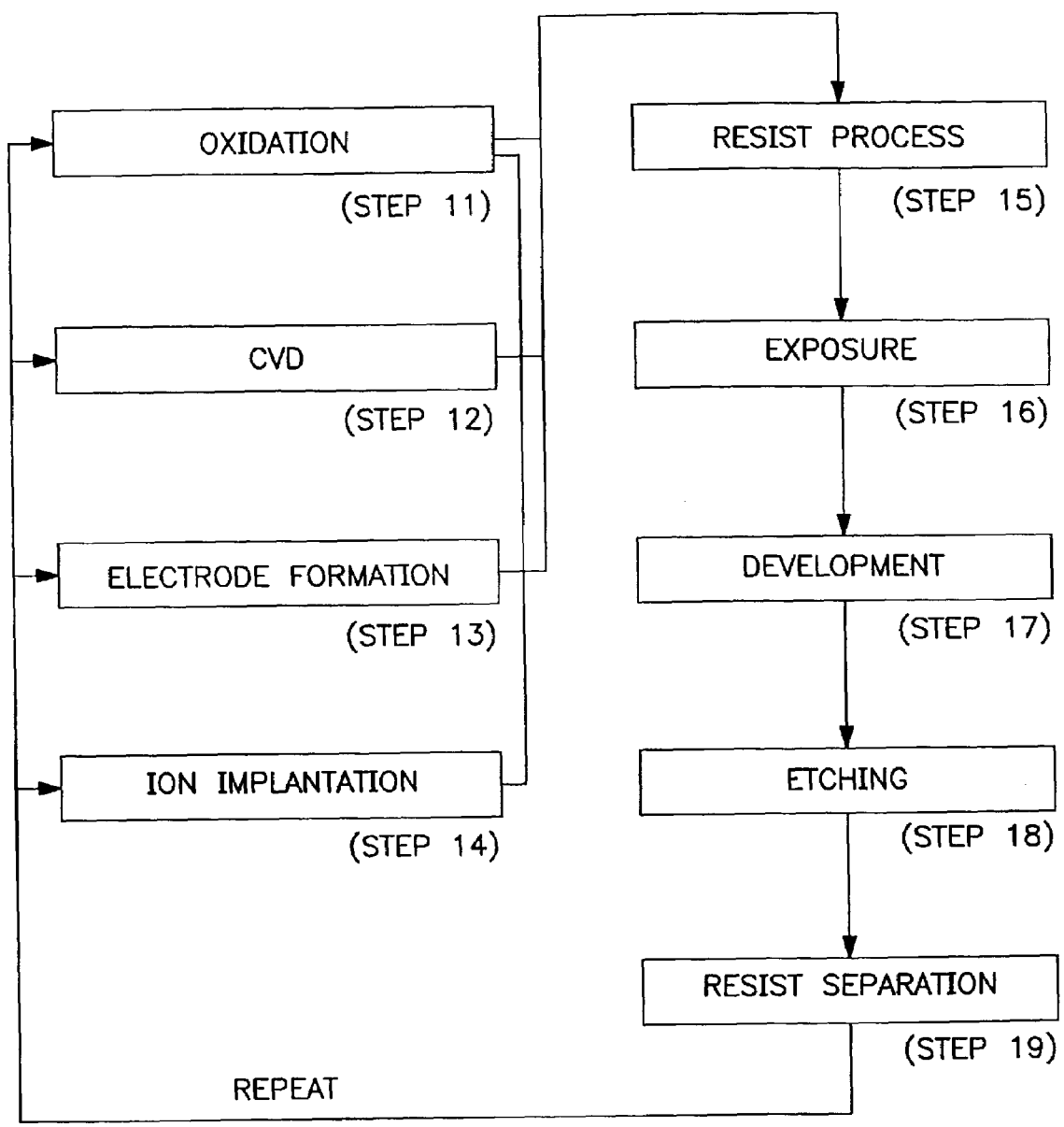
FIG. 24 is a flow chart of a wafer process, included in the sequence of FIG. 23.

FIG. 24 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus which has a projection optical system and exposes a substrate to light via a reticle and said projection optical system, while the substrate and the reticle are moved in a scan direction, said apparatus comprising:

a stage configured to hold the substrate and to move; and a sensor configured to detect a surface position of the substrate, in a direction of an optical axis of said projection optical system, with respect to each of detection points defined by positions of the substrate moved by said stage in the scan direction, wherein said apparatus is configured to perform a determination of whether said sensor is ineffective with respect to each of the detection points, based on whether each of the detection points is within an ineffective area on the substrate, the ineffective area being defined beforehand, and to control a position of said stage based on the surface position detected by said sensor with respect to each of the detection points at which said sensor is determined as being effective.

2. An apparatus according to claim 1, wherein said apparatus is configured to control height and tilt of said stage based on the detected surface position.

3. An apparatus according to claim 1, wherein said apparatus includes a plurality of said sensors.

4. An apparatus according to claim 3, wherein said apparatus is further configured to set the scan direction of said stage based on the determinations performed with respect to each of the detection points.

5. An apparatus according to claim 4, wherein said apparatus is configured to set the scan direction so that a number of the plurality of said sensors determined as being effective with respect to each of the detection points is decreased along the scan direction.

6. An exposure method applied to an exposure apparatus which has a projection optical system and exposes a substrate to light via a reticle and the projection optical system, while the substrate and the reticle are moved in a scan direction, said method comprising steps of:

detecting a surface position of the substrate in a direction of an optical axis of the projection optical system using a sensor with respect to each of detection points defined by positions of the substrate moved by a stage configured to hold the substrate and to move in the scan direction;

performing a determination of whether the sensor is ineffective with respect to each of the detection points, based on whether each of the detection points is within an ineffective area on the substrate, the ineffective area being defined beforehand;

positioning the stage based on the surface position detected by the sensor with respect to each of the detection points at which the sensor is determined as being effective in said performing step; and exposing the substrate, positioned in said positioning step, to light via the reticle and the projection optical system.

7. A method according to claim 6, wherein said positioning step controls height and tilt of the stage based on the detected surface positoin.

8. A method according to claim 6, wherein said detecting step detects the surface position using a plurality of the sensors.

9. A method according to claim 8, further comprising a step of setting the scan direction of the stage based on the determinations performed with respect to each of the detection points in said performing step.

10. A method according to claim 9, wherein said setting step sets the scan direction so that a number of the plurality of the sensors determined as being ineffective with respect to each of the detection points in said performing step is decreased along the scan direction.

* * * * *

UNITED STATES PATENT AND TRADEMARK OFFICE
CERTIFICATE OF CORRECTION

PATENT NO. : 7,166,855 B2
APPLICATION NO. : 10/341384
DATED : January 23, 2007
INVENTOR(S) : Yuichi Yamada et al.

Page 1 of 1

It is certified that error appears in the above-identified patent and that said Letters Patent is hereby corrected as shown below:

COLUMN 2:
Line 45, "bottle neck" should read -- bottleneck --.

COLUMN 7:
Line 55, "opposes" should read -- opposing --.

COLUMN 11:
After line 18 and before line 19, insert -- [Second Embodiment] --.
Line 64, "hands," should read -- hand, --.

COLUMN 13:
After line 44 and before line 45, insert -- [Third Embodiment] --.

COLUMN 16:
Line 18, "(slit). While" should read -- (slit), while --.

COLUMN 18:
After line 24 and before line 25, insert -- [Embodiment of Microdevice Manufacture] --.

Signed and Sealed this

Twenty-eighth Day of August, 2007

JON W. DUDAS
*Director of the United States Patent and Trademark Office*